(12) United States Patent
Smith et al.

(10) Patent No.: US 12,249,829 B2
(45) Date of Patent: Mar. 11, 2025

(54) METHODS AND APPARATUS FOR DETERMINING CONDITIONS OF POWER LINES

(71) Applicant: ACLARA TECHNOLOGIES, LLC, St. Louis, MO (US)

(72) Inventors: Roger A. Smith, Gibsonia, PA (US); Rebecca Ross, Apollo, PA (US)

(73) Assignee: Aclara Technologies LLC, St. Louis, MO (US)

(*) Notice: Subject to any disclaimer, the term of this patent is extended or adjusted under 35 U.S.C. 154(b) by 116 days.

(21) Appl. No.: 16/177,059

(22) Filed: Oct. 31, 2018

(65) Prior Publication Data

US 2019/0067941 A1   Feb. 28, 2019

Related U.S. Application Data

(62) Division of application No. 13/546,577, filed on Jul. 11, 2012, now abandoned.
(Continued)

(51) Int. Cl.
*H02J 13/00* (2006.01)
*G01R 15/14* (2006.01)
*H02J 3/00* (2006.01)

(52) U.S. Cl.
CPC ...... *H02J 13/00002* (2020.01); *G01R 15/142* (2013.01); *H02J 3/00* (2013.01);
(Continued)

(58) Field of Classification Search
CPC ........ H02J 13/00; H02J 3/001; G01R 15/142; Y04S 10/30
(Continued)

(56) References Cited

U.S. PATENT DOCUMENTS 3,777,217 A   12/1973   Groce et al.
4,420,752 A   12/1983   Davis et al.
(Continued)

FOREIGN PATENT DOCUMENTS

EP   0026801 A1   4/1981
EP   1505706 A1   2/2005
(Continued)

OTHER PUBLICATIONS

Poisson et al. "Detection and Measurement of Power Quality Disturbances Using Wavelet Transform," Jul. 2000, IEEE Transactions on Power Delivery, vol. 15, No. 3, pp. 1039-1044 (Year: 2000).*
(Continued)

*Primary Examiner* — Mohammad K Islam
*Assistant Examiner* — Xiuqin Sun
(74) *Attorney, Agent, or Firm* — Michael Best & Friedrich LLP

(57) ABSTRACT

Techniques for determining conditions of power lines in a power distribution system based on data collected by a plurality of sensor units deployed in the power distribution system. The techniques include obtaining data associated with measurements collected by at least two sensor units in the plurality of sensor units, and determining, by using at least one processor, at least one condition of at least one power line in the power distribution system by using the data obtained by the at least two sensor units.

20 Claims, 15 Drawing Sheets

Related U.S. Application Data

(60) Provisional application No. 61/640,777, filed on May 1, 2012, provisional application No. 61/598,664, filed on Feb. 14, 2012, provisional application No. 61/529,509, filed on Aug. 31, 2011, provisional application No. 61/529,554, filed on Aug. 31, 2011.

(52) U.S. Cl.
CPC .......... *H02J 3/00125* (2020.01); *H02J 13/00* (2013.01); *H02J 13/00017* (2020.01); *H02J 13/00034* (2020.01); *H02J 2203/20* (2020.01); *Y02E 60/00* (2013.01); *Y04S 10/30* (2013.01); *Y04S 10/52* (2013.01); *Y04S 40/20* (2013.01)

(58) Field of Classification Search
USPC .......................................................... 702/59
See application file for complete search history.

(56) References Cited

U.S. PATENT DOCUMENTS

| | | | |
|---|---|---|---|
| 4,581,606 A | 4/1986 | Mallory | |
| 4,689,752 A | 8/1987 | Fernandes et al. | |
| 4,709,399 A | 11/1987 | Fernandes | |
| 4,728,887 A | 3/1988 | Davis | |
| 4,801,937 A | 1/1989 | Fernandes | |
| 4,808,971 A | 2/1989 | Fernandes et al. | |
| 4,829,298 A | 5/1989 | Fernandes | |
| 5,006,846 A | 4/1991 | Granville et al. | |
| 5,235,861 A | 8/1993 | Seppa | |
| 5,426,360 A | 6/1995 | Mario et al. | |
| 5,684,507 A | 11/1997 | Rasnake et al. | |
| 5,684,508 A | 11/1997 | Brilman | |
| 5,684,710 A | 11/1997 | Ehlers et al. | |
| 5,708,679 A | 1/1998 | Fernandes et al. | |
| 5,715,058 A | 2/1998 | Bohnert et al. | |
| 5,729,144 A | 3/1998 | Cummins | |
| 5,995,911 A | 11/1999 | Hart | |
| 6,005,759 A | 12/1999 | Hart et al. | |
| 6,205,867 B1* | 3/2001 | Hayes ...................... | G01C 9/00 73/862.391 |
| 6,301,514 B1 | 10/2001 | Canada et al. | |
| 6,535,797 B1 | 3/2003 | Bowles et al. | |
| 6,597,180 B1 | 7/2003 | Takaoka et al. | |
| 6,660,934 B1 | 12/2003 | Nourai et al. | |
| 6,751,562 B1 | 4/2004 | Blackett et al. | |
| 6,940,702 B2 | 9/2005 | Kojovic et al. | |
| 7,058,524 B2 | 6/2006 | Hayes et al. | |
| 7,075,308 B2 | 7/2006 | Rockwell | |
| 7,135,580 B2 | 11/2006 | Bonrath et al. | |
| 7,135,850 B2 | 11/2006 | Ramirez | |
| 7,468,661 B2 | 12/2008 | Petite et al. | |
| 7,714,735 B2* | 5/2010 | Rockwell ............... | G01R 31/52 340/635 |
| 7,987,071 B1 | 7/2011 | Dorfman et al. | |
| 8,103,466 B2 | 1/2012 | Taft | |
| 8,536,857 B2 | 9/2013 | Nero, Jr. | |
| 8,587,445 B2 | 11/2013 | Rockwell | |
| 8,896,291 B2 | 11/2014 | Nero, Jr. | |
| 9,069,024 B2 | 6/2015 | Nero, Jr. | |
| 8,941,491 B2 | 7/2015 | Polk et al. | |
| 9,158,036 B2 | 10/2015 | Liu et al. | |
| 2002/0038199 A1 | 3/2002 | Blemel | |
| 2003/0161084 A1 | 8/2003 | Potts et al. | |
| 2003/0216876 A1 | 11/2003 | Premeriani et al. | |
| 2004/0169171 A1 | 9/2004 | Reeves et al. | |
| 2005/0017751 A1 | 1/2005 | Gunn et al. | |
| 2005/0145018 A1 | 7/2005 | Sabata et al. | |
| 2005/0151659 A1 | 7/2005 | Donovan et al. | |
| 2005/0171647 A1 | 8/2005 | Kunsman et al. | |
| 2005/0191647 A1 | 9/2005 | Kunsman et al. | |
| 2006/0056370 A1 | 3/2006 | Hancock et al. | |
| 2006/0077918 A1 | 3/2006 | Mao et al. | |
| 2006/0275532 A1 | 12/2006 | Dechert | |
| 2007/0059986 A1 | 3/2007 | Rockwell | |
| 2008/0036620 A1 | 2/2008 | McCollough | |
| 2008/0238404 A1* | 10/2008 | Ferguson ............ | H02J 13/0005 324/76.11 |
| 2009/0012727 A1* | 1/2009 | Siew ................... | G01R 31/088 702/59 |
| 2009/0027932 A1 | 1/2009 | Haines et al. | |
| 2009/0138229 A1 | 5/2009 | Englehardt et al. | |
| 2009/0243876 A1 | 10/2009 | Lilien et al. | |
| 2010/0013457 A1 | 1/2010 | Nero, Jr. | |
| 2010/0114392 A1 | 5/2010 | Lancaster | |
| 2010/0152910 A1 | 6/2010 | Taft | |
| 2010/0188239 A1 | 7/2010 | Rockwell | |
| 2010/0237852 A1 | 9/2010 | Tazzan et al. | |
| 2011/0082596 A1 | 4/2011 | Meagher et al. | |
| 2011/0187578 A1 | 8/2011 | Farneth et al. | |
| 2011/0238374 A1 | 9/2011 | Lancaster | |
| 2011/0282508 A1 | 11/2011 | Goutard et al. | |
| 2011/0288777 A1 | 11/2011 | Gupta | |
| 2012/0004869 A1* | 1/2012 | Saarinen ................ | G01R 31/58 702/59 |
| 2012/0029871 A1 | 2/2012 | Spillane | |
| 2012/0046799 A1 | 2/2012 | Alex et al. | |
| 2012/0077527 A1* | 3/2012 | Santiago ........... | H02J 13/00002 455/466 |
| 2012/0278011 A1 | 11/2012 | Lancaster | |
| 2013/0050478 A1 | 2/2013 | Tadepalli | |
| 2013/0054162 A1 | 2/2013 | Smith et al. | |
| 2013/0054183 A1 | 2/2013 | Afzal et al. | |
| 2013/0134998 A1 | 5/2013 | Kiko et al. | |
| 2013/0205900 A1 | 8/2013 | Nulty | |
| 2013/0328546 A1 | 12/2013 | Nero, Jr. | |
| 2014/0052388 A1 | 2/2014 | Mahlen et al. | |
| 2014/0136140 A1 | 5/2014 | Chan et al. | |
| 2014/0143578 A1 | 5/2014 | Cenizal et al. | |
| 2014/0163884 A1 | 6/2014 | Lilien et al. | |
| 2014/0288863 A1 | 9/2014 | Stevenin | |
| 2015/0069998 A1 | 3/2015 | Nero, Jr. | |
| 2015/0276818 A1 | 10/2015 | Nulty | |
| 2016/0061862 A1 | 3/2016 | Nulty | |

FOREIGN PATENT DOCUMENTS

| | | |
|---|---|---|
| EP | 2081273 A2 | 7/2009 |
| GB | 367244 A | 2/1932 |
| GB | 1501351 A | 2/1978 |
| JP | 2004168914 A | 6/1992 |
| JP | 2006102308 A | 4/1994 |
| JP | 08-265959 A | 10/1996 |
| JP | 2010054863 | 2/1998 |
| WO | 99/42844 A1 | 8/1999 |
| WO | 00/60367 A1 | 10/2000 |
| WO | 01/09628 A1 | 2/2001 |
| WO | 2004/068151 A1 | 8/2004 |
| WO | 2005/019846 A1 | 3/2005 |
| WO | 2005/067686 A2 | 7/2005 |
| WO | 2005/091958 A2 | 10/2005 |
| WO | 2006/021030 A1 | 3/2006 |
| WO | 2006/031739 A2 | 3/2006 |
| WO | 2006/092632 A2 | 9/2006 |
| WO | 2007/134022 A2 | 11/2007 |
| WO | 2009/120537 A1 | 10/2009 |
| WO | 2010/127145 A1 | 4/2010 |
| WO | 2011/000754 A1 | 1/2011 |
| WO | 2013/033387 A1 | 3/2013 |
| WO | 2013/076975 A1 | 5/2013 |
| WO | 2014/088562 A1 | 6/2014 |
| WO | 2014/105018 A1 | 7/2014 |

OTHER PUBLICATIONS

Shultz et al., Calculation of Maximum Harmonic Currents and Voltages on Transmission Lines, Apr. 1983, IEEE Transactions on Power Apparatus and Systems, vol. PAS-102, No. 4, pp. 817-821.
Written Opinion of the International Searching Authority for PCT/US2012/053106 mailed Apr. 1, 2013.

(56) References Cited

OTHER PUBLICATIONS

Written Opinion of the International Searching Authority for PCT/US2012/053125 mailed Apr. 1, 2013.
International Search Report and Written Opinion for International Application No. PCT/US2013/025946, mailed May 29, 2013.
International Preliminary Report on Patentability for Application PCT/US2013/025946 mailed Aug. 28, 2014.
International Preliminary Report on Patentability for Application No. PCT/US2012/053106 mailed Mar. 13, 2014.
International Search Report and Written Opinion for Application No. PCT/US2012/067285 mailed Mar. 27, 2013.
International Preliminary Report on Patentability and Written Opinion for Application No. PCT/US2012/067285 mailed Jun. 12, 2014.
International Search Report and Written Opinion for Application No. PCT/US2015/023467 mailed Oct. 5, 2015.
International Search Report and Written Opinion for Application No. PCT/US2015/047404 mailed Dec. 10, 2015.
No Author Listed] ABB Improves Grid Reliability in Algeria. Edited Jun. 13, 2006. Last accessed on Dec. 11, 2006 at : Http://www.abb.com/cawp/dl8e8cf73169fbc125714900427925.aspx? 2pgs.
Brambley et al., Wireless Sensor Applications for Buildings Operation and Management. Http://www.building.svstemsprogram.pnl.Gov/wireless/publications/pnn1-sa-43465.pdf 2005. 40 pages.
[No Author Listed] Cooper Power Systems, S.T.A.R. Faulted Circuit Indicators. Bulletin No. 98025. Jun. 1998. 2 pages.
Doig et al., Reclassification of Relay-Class Current Transformers for Revenue Metering Applications. © 2005 IEEE Reprinted from the proceeding of the IEEE T&D PES Conference. 8 pages.
Govindarasu et al., SST-Sensor Network Design for a Secure National Electric Energy Infrastructure. Iowa State University, Department of Electrical Engineering, 2004. http://www.aistate.edu/bstrctsvicewabstract.asp?id=1920 2 pages.
[No Author Listed] GridSense website http:/www.gridsense.net/products_lt30.shtml. Aug. 4, 2006. 5 pages.
Hacker et al., Securing America's Power Grid. Iowa State University: News Service. Jun. 26, 2006.http://www.astate/edu-nscentral//news/2006/jun/grid.shtml. 2 pages.
Nordman et al., Design of a Concept and a Wireless ASIC Sensor for Locating Earth Faults in Unearthed Electrical Distribution Networks. IEEE Transactions on Power Delivery. 2006;21(3):1074-82.
Nordman, An Architecture for Wireless Sensors in Distributed Management of Electrical Distribution Systems. Helsinki University of Technology. Http://1ib.tkkfi/Diss/2004/isbn9512272989.pdf. Nov. 19, 2004. 74 pages.
Ozaki et al., A Fault-Tolerant Model for Wireless Sensor-Actor System. IEEE Computer Society, Proceedings of 20th International Conference on Advance Information Networking and Applications. 2006. 5 pages.
Poisson et al., Detection and measurement of power quality disturbances using wavelet transform. IEEE Transactions of Power Delivery. Jul. 2000; 15(3):1039-44.
Risley et al., Electronic Security Risks Associated With Use of Wireless, Point-to-Point Communications in the Electric Power Industry. 2003. 16 pages.
Santoso et al., Power quality assessment via wavelet transform analysis. IEEE Transaction on Power Delivery. Apr. 1996; 11(2):924-30.
Solodovnik et al., Wireless Sensing and Controls for Survivable AC Zonal System. 2004. http://www.actapress.com/PaperInfo.aspx?PaperID= 1790 I. 2 pages.
Sun et al., Fault-Tolerant Cluster-Wise Clock Synchronization for Wireless Sensor Networks, IEEE Transactions on Dependable and Secure Computing. 2005;2(3): 177-89.
Sushama et al., Detection of power quality disturbances using wavelet transforms. Int J Computer. 2010; 18(1):61-6.
Office Action issued in Canadian Patent Application No. 3,094,770 dated Oct. 15, 2021 (5 pages).
Zheng et al., "Power system transient and harmonic studies using wavelet transform", IEEE Transactions on Power Delivery, 14(4), pp. 1461-1468, DOI: 10.1109/61.796241, Oct. 1, 1999.

\* cited by examiner

METHODS AND APPARATUS FOR DETERMINING CONDITIONS OF POWER LINES

CROSS-REFERENCE TO RELATED APPLICATIONS

The present application is a divisional of U.S. patent application Ser. No. 13/546,577, filed on Jul. 11, 2012, titled "Methods And Apparatus For Determining Conditions Of Power Lines," that claims the benefit under 35 U.S.C. § 119(e) of U.S. Provisional Application Ser. No. 61/529,554, filed on Aug. 31, 2011, titled "Communications and Analytics Architectures for Distributed Sensing", Provisional Application Ser. No. 61/529,509, filed on Aug. 31, 2011, titled "Analytics for Distributed Smart Grid Sensing", Provisional Application Ser. No. 61/598,664, filed on Feb. 14, 2012, titled "Power Line Management System," and Provisional Application Ser. No. 61/640,777, filed on May 1, 2012, titled "Power Distribution Line Fault Distance Measurement." Each of the above-identified applications is hereby incorporated by reference in its entirety.

BACKGROUND

Power lines are widely used in many settings. They form an important part of the power distribution system, carrying power from generation facilities all the way to the locations where it is used. The power distribution system may include many types of power lines, for example, with high voltage lines used closer to the power generation facilities and medium and lower voltage lines closer to the locations where the power is used such as homes and businesses.

Many of the lines run "overhead," meaning that the lines are attached to towers or poles that elevate the lines above the ground. High voltage lines are generally routed through open spaces, but medium and low voltage lines, which are closer to locations that use power, are more likely to run over roads and near trees or other objects.

A power company may spend significant amounts of resources repairing and maintaining these power lines. Environmental conditions may damage the power lines. For example, ice and snow buildup on a power line may load the line to the point that it stretches and breaks. Wind can also be a contributing factor to breakage or wear of a power line. Wind can directly cause damage to a line or can cause tree limbs or other obstacles to come in contact with the line, thus damaging it. Animals (e.g., squirrels) can come into contact with a power line causing a temporary fault. A power line may also be damaged by objects such as fallen tree branches.

Further, power lines can experience damage or wear through overloading. When large amounts of current flow through a power line, the line may heat up, causing the line to stretch. Too much stretching, in turn, may lead to breakage of the line and, as such, create a dangerous scenario for people and property under the overhead line.

Accordingly, a power company may devote significant personnel and financial resources to checking power lines for the presence of these conditions and addressing the resulting issues.

SUMMARY

Improved power line management is facilitated through a system that collects data about power lines from multiple sensor units in a power distribution system. The data may be aggregated and analyzed to determine conditions of power lines requiring maintenance. Determining conditions of power lines may include determining current power line conditions requiring maintenance, predicting future conditions for which maintenance is likely to be required for one or more power lines, or both. This information may be used to schedule maintenance and identify the locations at which that maintenance is to be performed.

A monitoring system for determining conditions of power lines requiring maintenance may include multiple sensor units attached to the power lines. Each sensor unit may contain multiple types of sensors. The sensor units may collect data about the power lines and the collected data may be processed to extract features for determining conditions on the power lines.

Sensor units may be deployed at one location or multiple locations in a power distribution system. Because a power line may comprise multiple conductors with each conductor having a voltage at a different phase, sensor units may be deployed on one or multiple conductors, associated with different phases, in a power line at each location. Accordingly, a monitoring system may use data collected from one or more conductors in one or more different locations in the power distribution system to determine conditions of one or more power lines.

Accordingly, in some aspects, the invention may be embodied as a method for determining conditions of power lines in a power distribution system based on data collected by a plurality of sensor units deployed in the power distribution system. The method comprises acts of obtaining data associated with measurements collected by at least two sensor units in the plurality of sensor units, and determining, by using at least one processor, at least one condition of at least one power line in the power distribution system by using the data obtained by the at least two sensor units.

In yet another aspect, the invention may be embodied as at least one tangible computer readable storage medium storing processor executable instructions that, when executed by at least one processor, cause the at least one processor to perform a method for determining conditions of power lines in a power distribution system based on data collected by a plurality of sensor units deployed in the power distribution system. The method comprises acts of obtaining data associated with measurements collected by at least two sensor units in the plurality of sensor units, and determining at least one condition of at least one power line in the power distribution system by using the data obtained by at the least two sensor units.

In yet another aspect, the invention may be embodied as a monitoring system for determining conditions associated with power conditioning components in a power distribution system. The monitoring system comprises at least one sensor unit configured to measure first power factor on a first phase of a power line in the power distribution system, wherein the power line is electrically coupled to at least one power conditioning component. The system further comprises at least one processor configured to compare the measured first power factor with stored power factor information associated with the first phase of the power line to produce first comparison results, and determine whether the at least one power conditioning component has a fault condition based on the comparison results.

Because sensor units at different locations may collect data reflecting the same condition or conditions at different times, processing data collected by the sensor units may include deriving features from the data so that these features are independent of the location of the sensor units that collected the data as well as of the time(s) when these sensor units collected the data. To this end, collected data may be processed by using a shift-invariant transformation, and features for determining conditions of the power lines may be obtained from the transform coefficient values resulting from the application of the shift-invariant transformation to the data. The transform coefficient values may be computed by either the sensor units or any other suitable computing device or devices configured to receive data collected by the sensor units.

Accordingly, in some aspects, the invention may be embodied as a method for determining conditions of power lines in a power distribution system based on measurements collected by a plurality of sensor units deployed in the power distribution system. The method comprises obtaining first transformed data associated with a first set of one or more measurements collected by a first sensor unit in the plurality of sensor units and second transformed data associated with a second set of one or more measurements collected by a second sensor unit in the plurality of sensor units; and determining, by using at least one processor and based at least in part on one or more features calculated from the first transformed data and the second transformed data, at least one condition of at least one power line in the power distribution system.

In another aspect, the invention may be embodied as a management system for a power distribution system comprising a plurality of power lines, a plurality of sensor units configured to collect measurements about power lines in the plurality of power lines, wherein the plurality of sensor units includes a first sensor unit and a second sensor unit adapted to be coupled to a different power line from the first sensor unit. The management system comprises at least one controller configured to obtain first transformed data associated with a first set of one or more measurements collected by the first sensor unit and second transformed data associated with a second set of one or more measurements collected by the second sensor unit. The at least one controller is further configured to determine, based at least in part on one or more features calculated from the first transformed data and the second transformed data, at least one condition of at least one power line in the power distribution system.

In yet another aspect, the invention may be embodied as a sensor unit configured to be coupled to a power line. The sensor unit is also configured to collect a set of one or more measurements from the power line, apply a shift-invariant transformation to the set of one or more measurements to produce a first plurality of transform coefficient values, and transmit transform coefficient values in the first plurality of transformed coefficient values.

In yet another aspect, the invention may be embodied as at least one tangible computer readable storage medium. The at least one computer readable storage medium stores processor-executable instructions that, when executed by at least one processor, cause the at least one processor to perform a method for determining conditions of power lines in a power distribution system based on measurements collected by a plurality of sensor units deployed in the power distribution system. The method comprises obtaining first transformed data associated with a first set of one or more measurements collected by a first sensor unit in the plurality of sensor units and second transformed data associated with a second set of one or more measurements collected by a second sensor unit in the plurality of sensor units. The method further comprises determining, based at least in part on one or more features calculated from the first transformed data and the second transformed data, at least one condition of at least one power line in the power distribution system.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
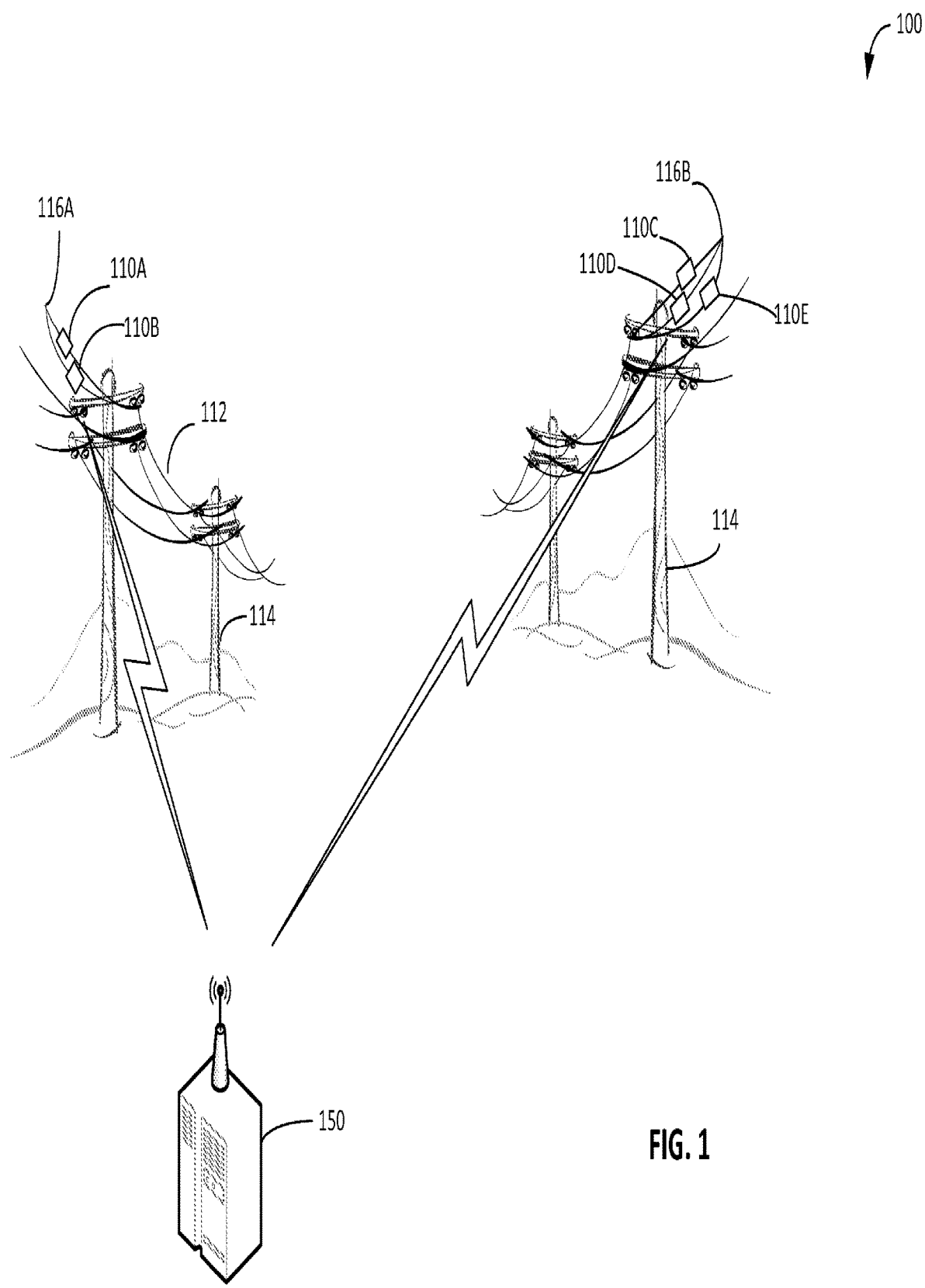
FIG. 1 is a schematic illustration of a power distribution system equipped with components for determining at least one condition of one or more power lines needing maintenance, in accordance with some embodiments of the present invention.

The inventors have recognized and appreciated that improvements in power line management can be achieved by jointly processing data collected by multiple sensor units that monitor power lines as part of a power line management system. Jointly analyzing data collected by multiple sensor units can be used to determine conditions within a power distribution system requiring maintenance or that are indications that maintenance will be required.

Such a system may be used to diagnose conditions needing maintenance, and, in some embodiments, may determine information about the conditions, such as the location and/or the nature of the condition. This information may be the basis of efficient dispatch of personnel for making repairs. The resultant predictions may be used to schedule maintenance to avoid a power outage, avoid unsafe conditions (e.g., a downed cable or an overhead cable that sags so that a person or objects below the cable are at risk of contact with the cable) or to otherwise address the conditions, thereby avoiding service disruptions and/or allowing efficient dedication of service resources by an entity or entities responsible for maintaining the power distribution system. For example, conditions likely to require maintenance may be addressed proactively through preventative maintenance rather than as a costly or time-consuming repair after an actual failure has occurred.

In some embodiments, measurements are collected by multiple sensor units attached to power lines at one or multiple locations throughout a power distribution system. One or multiple sensor units may be deployed at each such location. A conventional power distribution system may have power lines that comprise multiple conductors. For example, a power line may comprise three conductors carrying operating at three different phases. These conductors are sometimes referred to as "phases." Thus, a sensor unit may be deployed on each of one or multiple phases at each location along a power line. Accordingly, a power line monitoring system may use data collected by multiple sensor units deployed at one or multiple locations, with one or multiple sensor units deployed at each location.

Data collected by one or multiple sensor units may be processed to identify features that, in turn, may be used to determine conditions in the power distribution system. The features may be identified by using one or more rules and a rules engine. Additionally or alternatively, the features may be identified by using techniques that take into account time differences corresponding to when each sensor unit collected measurements about the power distribution system.

In addition to data collected by multiple sensor units, additional network information may be used to determine conditions in the power distribution system. Such additional information may include, but is not limited to, information about the layout of power lines (sometimes referred to as "network topology information"), information about flow of current throughout the power distribution system, the gauge of wire used, the impedance of conductors used, and information about the location of substations and other power distribution system components in the power distribution system. This information may be used to analyze and process data collect by the sensor units.

Techniques for determining conditions within a power distribution network as disclosed herein may be used to identify any of numerous types of conditions. Examples of such types of conditions include, but are not limited to, contact between an animal or an object (e.g., a tree) and a power line, sag of a power line, oscillation (e.g., gallop, flutter, etc.) of a power line, conditions associated with weather (e.g., lightning, ice, snow, wind, rain, heat, cold, etc.), a ground fault, and a blown fuse or fuses in a bank of capacitors.

In some embodiments, data collected by multiple sensor units may be used to identify information indicative of a location of a condition in the power distribution network. As one example, information indicating that a fault is occurring between two sensors may be identified. The location order of sensor units within the power distribution network may be used to identify such information. For example, in some instances sensor unit A may identify a fault current, but another sensor unit B may not identify the fault current. This may indicate that the location of the fault current is along a power line between the locations of sensor A and sensor B. In some instances, even more precise information about the location of a condition may be obtained. For example, a distance to the location of a fault from a component (e.g., a substation, a sensor unit, etc.) in the power distribution network may be identified. As an example of location identification through joint processing of sensor data, a current measurement obtained by a sensor upstream of a fault may be processed together with a voltage measurement obtained by a sensor downstream of the fault in order to identify a distance to the fault. Such information may help to expedite maintenance to address the condition.

In some embodiments, measurements are collected by multiple sensor units attached to power lines at multiple locations throughout a power distribution system. However, in some embodiments, such sensor units may not be synchronized or otherwise be operating with a common time reference. The inventors have recognized and appreciated that more accurate determination of conditions on the power lines may be made, even in these circumstances, if differences in the times at which these data are collected are taken into account when processing these data. In some embodiments, differences in data collection time is taken into account by transforming data collected from different sensors is represented in a time invariant way. As a specific example, data collected by multiple sensor units may be transformed by using a shift-invariant transformation to produce transformed data from which one or more features for determining conditions in the power distribution network may be obtained. The obtained features may be independent of when the data was collected by the sensor units.

The shift-invariant transformation may be applied to data collected by one sensor unit to produce one set of transform coefficient values and to data collected by another sensor unit to produce another set of transform coefficient values. Applying the same shift-invariant transformation to both sets of data results in a correspondence between the obtained sets of transform coefficient values. As such, a feature obtained from transform coefficient values calculated from data collected by one sensor unit may be used together with another feature obtained from corresponding transform coefficient values calculated from data obtained by another sensor unit in order to determine one or more conditions in the power distribution network.

The features may have any suitable characteristics. Though, in some embodiments, the features may be patterns of coefficient values generated by the transformation of the data set collected by a sensor. The patterns, for example, may be defined in terms of an amount of energy in a coefficient or a group of coefficients. As an example of a feature of this type, oscillations due to wind may produce relatively high values for coefficients associated with low frequencies. In contrast, a sudden physical event, such as an object falling against a power line may produce relatively high values for coefficients associated with higher frequencies. A lightning strike may produce yet a different pattern, characterized by relatively high values for coefficients associated with both low and high frequencies.

It should be appreciated that a system may be constructed to recognize patterns associated with any suitable features. These patterns may be defined in terms of values, or "energy," present at each coefficient of the transform. Patterns may also be specified based on the absence of energy in certain coefficients. The patterns may be determined empirically or heuristically for any features of interest. Regardless of how these patterns are determined, the features recognized based on these patterns may then be used, either singly or in combination, to determine conditions on power lines in a power distribution system.

As a non-limiting illustrative example, in some instances the energy of a group of transform coefficient values obtained from measurements collected by one sensor unit may exceed a threshold. This may be indicative of any of numerous conditions such as animal contact with a power line or weather affecting multiple power lines. However, if the energy of corresponding transform coefficient values obtained from measurements collected by another sensor unit, which is attached to a different power line, also exceeds a threshold, it may be determined that these features (i.e., the computed energies) in combination are more likely indicative of a condition affecting multiple power lines (e.g., ice formed on multiple power lines) rather than a condition affecting a single power line (e.g., animal contact with the power line). On the other hand, if the energy of corresponding coefficient values obtained from measurements collected by the other sensor unit is below a threshold, it may be determined that these features in combination are more likely indicative (or predictive) of a condition affecting a single power line.

In some embodiments, the shift-invariant transformation may be a multi-resolution transformation. Applying the multi-resolution transformation to measurements collected by a sensor unit may provide features associated with different resolutions. Employing a multi-resolution transformation may aid determining multiple conditions because some conditions may manifest themselves differently in a multi-resolution transform domain. For example, one condition may have large transform coefficient values at one resolution while another condition may have large transform coefficient values at another resolution. Multi-resolution analysis of collected data may enable determination of transient conditions (e.g., a lightning strike) as well as slowly time-varying conditions (e.g., power line oscillation due to wind).

Though, it should be appreciated that patterns derived from sensors deployed in a power distribution system may reveal information about conditions without transforming sensor data. For example, changes in a value of a measured parameter or changes in a pattern of a measured parameter may indicate the presence or location of a fault. As a specific example, a change in a power factor pattern on a phase may indicate a blown fuse on the phase.

It should be appreciated that the various aspects and concepts of the present invention described herein may be implemented in any of numerous ways, and are not limited to any particular implementation technique. Examples of specific implementations are described below for illustrative purposes only, but the aspects of the invention described herein are not limited to these illustrative implementations.

FIG. 1 illustrates an environment in which the techniques described herein for determining at least one condition needing power line maintenance may be applied. In particular, FIG. 1 illustrates a power distribution network 100 that includes multiple overhead power lines 112. The overhead lines may be supported by towers and/or poles 114. As a result, each of the power lines 112 may have multiple segments, such as segments 116A and 116B, between the locations where the wires are attached to the towers and/or poles.

Sensor units may be attached to some or all of the power line segments. In the example illustrated in FIG. 1, sensor units 110A and 110B are shown as being attached to segment 116A of lines 112 and sensor units 110C, 110D, and 110E are shown as being attached to segment 116B of lines 112. In this example, sensor units are attached to a subset of the power line segments. Though, in some embodiments, a sensor unit may be attached to every power line segment; in other embodiments, sensor units may be selectively attached to power line segments. For example, sensor units may be selectively attached to power line segments that have characteristics representative of power line segments in a larger area (e.g., such line segments may be in locations having environmental conditions representative of environmental conditions of other line segments in a larger area). As another example, sensor units may be placed selectively on power line segments that are in locations carrying a greater risk of failure, such as windy locations, or posing a greater risk to people or objects below the power line segments if a failure should occur, as the case may be for power line segments spanning busy intersections. Thus, it should be appreciated that the number and locations of sensor units within power distribution network 100 is not critical to the invention.

A power line segment may comprise one or multiple conductors. When a power line segment comprises multiple conductors, the conductors may be associated with different phases. For example, a power line segment may comprise three conductors; such a power line segment may be referred to as a three-phase line.

A sensor unit may be attached to one or multiple conductors in a power line segment. A sensor unit may be attached to each of one, or two, or all three of the conductors in a three-phase line. For example, there may be two sensor units attached to a power line segment. In the example illustrated in FIG. 1, power line segment 116A is a three-phase line with sensor units 110A and 110B attached to different conductors. In the example illustrated in FIG. 1, power line segment 116B is a three-phase line with sensor units 110C, 110D, and 110E attached to different conductors in the power line segment.

It also should be appreciated that FIG. 1 shows a simplified representation of a power distribution system. A power distribution system may have many more poles and/or towers and many more power lines than illustrated. Moreover, FIG. 1 illustrates medium voltage lines. In some embodiments, sensor units may be preferentially attached to medium voltage lines because of the proximity of medium voltage lines to trees and other objects that could come into contact with the power lines. Medium voltage power lines also may be well suited for placement of sensor units because of the proximity of those lines to people or other objects that could be injured or damaged if a fault were to occur on such a line. Though, it should be appreciated that the specific type and structure of the lines to which sensor units are attached is not critical to the invention. Sensor units may be attached to any suitable type of line, including cables of various types.

Regardless of the numbers and locations of sensor units in the power distribution network, data collected at each sensor unit may be communicated to one or more computing devices for processing to determine a condition, on one or more of the power lines, indicating a current or predicted need for maintenance. In the example of FIG. 1, data from the sensor units is wirelessly communicated to controller 150. In this example, controller 150 is illustrated as a single computing device collecting data from all of the sensors. Though, it should be appreciated that in a power distribution network spanning a large area, multiple computing devices may be used to collect and process data from the sensors.

If multiple devices are used, they may be located in one location or distributed across multiple locations. In the latter case, they may be connected through a network and/or organized hierarchically such that each computing device in the hierarchy may be configured to collect and process data gathered by a subset of sensor units. For example, one computing device may be configured to collect and process data from sensor units in one geographic region and another computing device may be configured to collect and process data from sensor units in another geographic region.

FIG. 1 also shows data being transmitted directly from each sensor unit to controller 150. In some embodiments, the data may be transmitted through one or more intermediary devices. Moreover, FIG. 1 illustrates wireless communication as an example of a communications mechanism that may be employed. Any suitable communication mechanism may be used. For example, in some embodiments, the data may be communicated in whole or in part over the power lines themselves. As a specific example, a sensor unit connected to a central data collection point, such as controller 150, through a power line, may transmit data over that power line. If a fault or other condition prevents communication over the power line, the sensor unit may transmit data wirelessly to the central location directly or indirectly through another sensor unit or other suitable intermediary device. Accordingly, it should be appreciated that the specific communications mechanism employed is not critical to the invention.

In some embodiments, different types of sensor units may be deployed as part of a monitoring system. The deployed sensor units may have different hardware capabilities and may be deployed throughout the power distribution network based on their capability. For example, in some embodiments, high-fidelity sensor units (e.g., sensor units capable of obtaining measurements at a high rate, having more processing power, etc.) may be deployed at one or more locations in the power distribution network. Additionally, multiple lower fidelity sensor units (e.g., sensor units capable of obtaining measurements at a lower rate than the high-fidelity sensor units, having less processing power than the high-fidelity sensor units, etc.). Such a hierarchical architecture may reduce the cost of a monitoring system by avoiding the cost associated with installing high-fidelity sensor units in locations where lower fidelity sensor units may be sufficient.

Each sensor unit may contain one or more types of sensors and circuitry for controlling the collection of data and transmission of that data for analysis. In some embodiments, each sensor unit may contain circuitry for processing the data prior to transmission. The processing may, for example, result in the compression of the collected data to reduce the amount of data transmitted. Any suitable type of data compression techniques may be used. Data may be compressed by using lossless or lossy compression techniques, or any suitable combination thereof. Data may be compressed, for example, by extraction of features or parameters characterizing signals measured by sensors including any time-varying signals measured by the sensors. A further form of compression may entail transmission of samples of sensor data from time to time. Yet another example of compression may comprise applying a transformation, such as a shift-invariant transformation, to the data. For instance, a shift-invariant wavelet transformation may be applied to the data and one or more of the computed wavelet coefficients may be transmitted instead of or in addition to the data.

The times at which sensor data is transmitted may be periodic, randomized, and/or may be dynamically determined based on detection of changing conditions. For example, sensor data may be transmitted when there is a change in the environmental conditions (e.g., a snowstorm arrives, a tree falls, it becomes windy, etc.).

Figure 2:
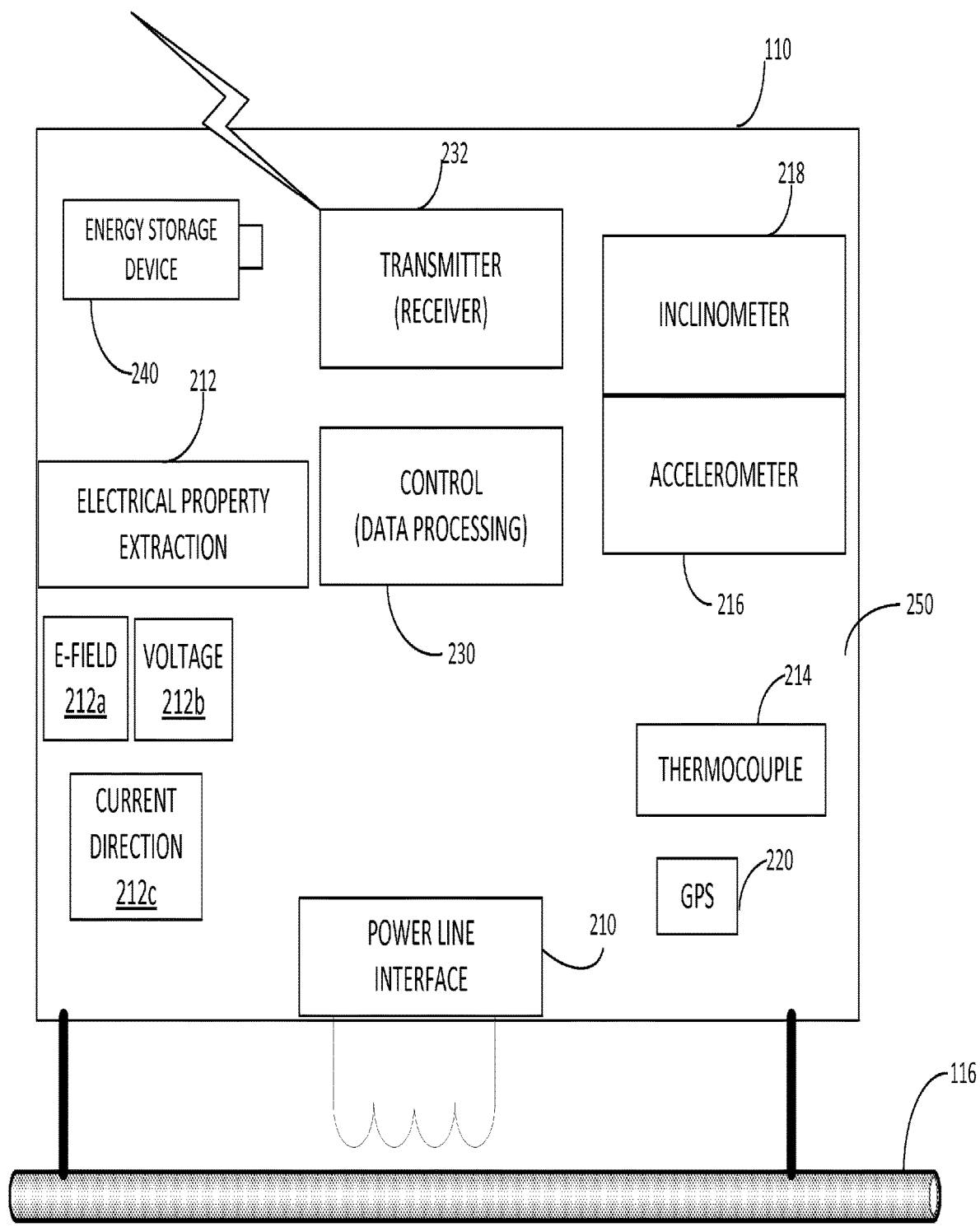
FIG. 2 is a functional block diagram of a sensor unit in accordance with some embodiments of a system for determining at least one condition of one or more power lines needing maintenance, in accordance with some embodiments of the present invention.

FIG. 2 illustrates an exemplary sensor unit 110. Here, sensor unit 110 is shown as being mechanically attached to line segment 116. The mechanical attachment is shown schematically in FIG. 2. Any suitable mechanical attachment technique, including clamps, adhesives or any other suitable mechanisms, may be used to attach each sensor unit to a line segment.

Each sensor unit may contain a housing 250 that is environmentally sealed. Such a housing may be manufactured with any suitable materials, including materials as are used in the art for components used in exterior locations, such as may be found in power distribution systems and/or telephone systems.

Sensors and control circuitry may be enclosed within the housing 250. One or more types of sensors may be included in a sensor unit. In the example illustrated in FIG. 2, sensors for measuring electrical and mechanical properties are both included in sensor unit 110. A power line interface 210 may be included to sense electrical properties on line segment 116. In some embodiments, power line interface 210 may include components for sensing those electrical properties without direct electrical connection to line segment 116. For example, capacitive or inductive coupling between power line interface 210 and line segment 116 may be employed.

Regardless of the specific mechanism used to electrically couple sensor unit 110 to line segment 116, sensor unit 110 may include circuitry 212 for extracting electrical properties of the line segment. To this end, circuitry 212 may include one or more sensors configured to extract electrical properties. For example, circuitry 212 may include electric field sensor 212a, voltage sensor 212b, and current direction sensor 212c. In some embodiments, voltage sensor 212b may be configured to detect voltage harmonics on the line. Though, it should be recognized that circuitry 212 may include and/or be coupled to any suitable sensor for determining electrical properties. Circuitry 212 may use techniques as are known in the art to determine electrical properties, such as voltage or current on line 116. In this way, circuitry 212, in combination with power line interface 210, may act as a sensor for electrical properties.

Other mechanical properties may be measured. For example, FIG. 2 shows that sensor unit 110 includes thermocouple 214. Thermocouple 214 may be configured to measure the temperature of line 116 and output a signal reflecting the temperature.

Yet further sensors may be configured to measure inertial properties of line segment 116. In this example, inclinometer 218 and accelerometer 216 are included for measuring inertial properties. Because these sensors are coupled through housing 250 to line segment 116, the inclination or acceleration measured by these sensors reflect conditions on line segment 116. The inertial sensors may be constructed using techniques as are known in the art. For example, such sensors may be manufactured using microelectronic manufacturing techniques. Though, it should be appreciated that the specific construction of the inertial sensors is not critical to the invention.

Regardless of how the sensors may be constructed, inclinometer 218 may output a signal representing a tilt of inclinometer 218, which, because of the mechanical coupling through housing 250 to line 116, may represent an amount of sag on line 116. Similarly, the output of accelerometer 216 may reflect acceleration on line 116. Other inertial sensors, such a sensor for velocity, alternatively or additionally may be included within sensor unit 110. Though, in some embodiments, other inertial measurements, such as velocity, may be derived from one or more of the inertial measurements made. For example, velocity may be derived through computations on outputs produced by accelerometer 216.

It should be appreciated that any of the above-mentioned sensors may be used to measure any of the above-described properties at any suitable time. Each sensor may measure properties that the sensor is configured to measure multiple times such that the sensor may produce a time-series of measurements of a time-varying characteristic. For example, thermocouple 214 may be configured to produce a time-series of temperature measurements. As another example, circuitry 212 may be configured to produce a time-series of measurements of a particular electrical property.

It should be appreciated that sensor unit 110 may comprise any of numerous other types of sensors in addition to or instead of the above-described sensors. For example, sensor unit 110 may comprise a GPS sensor such as GPS sensor 210 configured to obtain location and/or time information.

Regardless of the number and types of sensors within sensor unit 110, the outputs of the sensors may be collected by control circuitry 230. Control circuitry 230 may be implemented using circuitry design techniques as are known in the art. Control circuitry 230, for example, may be implemented as a programmable logic device programmed to perform techniques as described herein. In other embodiments, control circuitry 230 may be a general-purpose microcontroller or other processor that may be programmed through instructions stored in nonvolatile memory. As another option, control circuitry 230 may be custom-designed circuitry such that it is programmed to perform the processing described herein based on the layout of circuit elements in the circuitry.

Regardless of the specific construction of control circuitry 230, control circuitry 230 may be configured collect data from the sensors within sensor unit 110 and control transmitter 232 to transmit that data. In the example of FIG. 1, transmitter 232 may be configured to transmit data in accordance with a protocol recognized by controller 150. In some embodiments, control circuitry 230 may process the data collected from the sensors prior to transmission.

That processing may include data compression or other processing operations. As one example, the processing may include time-domain, frequency-domain, time-frequency domain, and/or time-scale domain analysis on time-varying outputs of one or more sensor units. For example, performing time-scale domain analysis may include performing a multi-resolution transformation via a wavelet transformation as is known in the art. In some embodiments, the processing may be performed in accordance with a time-invariant wavelet transformation. The transformation may be a discrete-time wavelet transformation. Such a transformation may generate one or more transform coefficient values representing a signal collected at the output of a sensor such that transmission of the coefficients may convey useful information in the signal, but may consume a much lower bandwidth upon transmission. Though, it should be appreciated that any other suitable signal processing techniques (e.g., Fourier techniques, Gabor analysis, discrete cosine transform, etc.) may be applied to the outputs of the sensors.

Alternatively or additionally, processing may include tagging data prior to its transmission. The data may be tagged in any suitable way, such as by including data to indicate the sensor unit at which the data was collected or the line segment for which the data is collected. Tagging may also indicate which sensor unit collected the data and any suitable information associated with the sensor unit such as the location of the sensor unit. Tagging may also indicate a time at which the data was collected or any other parameters useful in analyzing the data including, but not limited to, parameters indicating how the data may have been processed prior to transmission.

Though FIG. 1 shows data being sent uni-directionally, from sensor units to a computing device, in some embodiments, two-way communication may be supported. In those embodiments, transmitter 232 may be a portion of a radio that also operates as a receiver. Information received may represent commands to sensor unit 110 to trigger sensor unit 110 to perform functions that it is already configured to perform or to reconfigure sensor unit 110 to perform additional functions. Commands received over a communications link, for example, may trigger sensor unit 110 to collect and/or report sensor measurements. Though, the specific commands to which sensor unit 110 may respond are not critical to the invention, and sensor unit 110 may be configured to respond to any suitable commands.

It should be appreciated that FIG. 2 is a simplified representation of a sensor unit. Other components may alternatively or additionally be included. For example, FIG. 2 illustrates that sensor unit 110 includes a power source, which is illustrated as charge storage device 240 in FIG. 2. Charges storage device 240, for example, may be a battery or a super capacitor. However, any suitable power source alternatively or additionally may be included.

Figure 3:
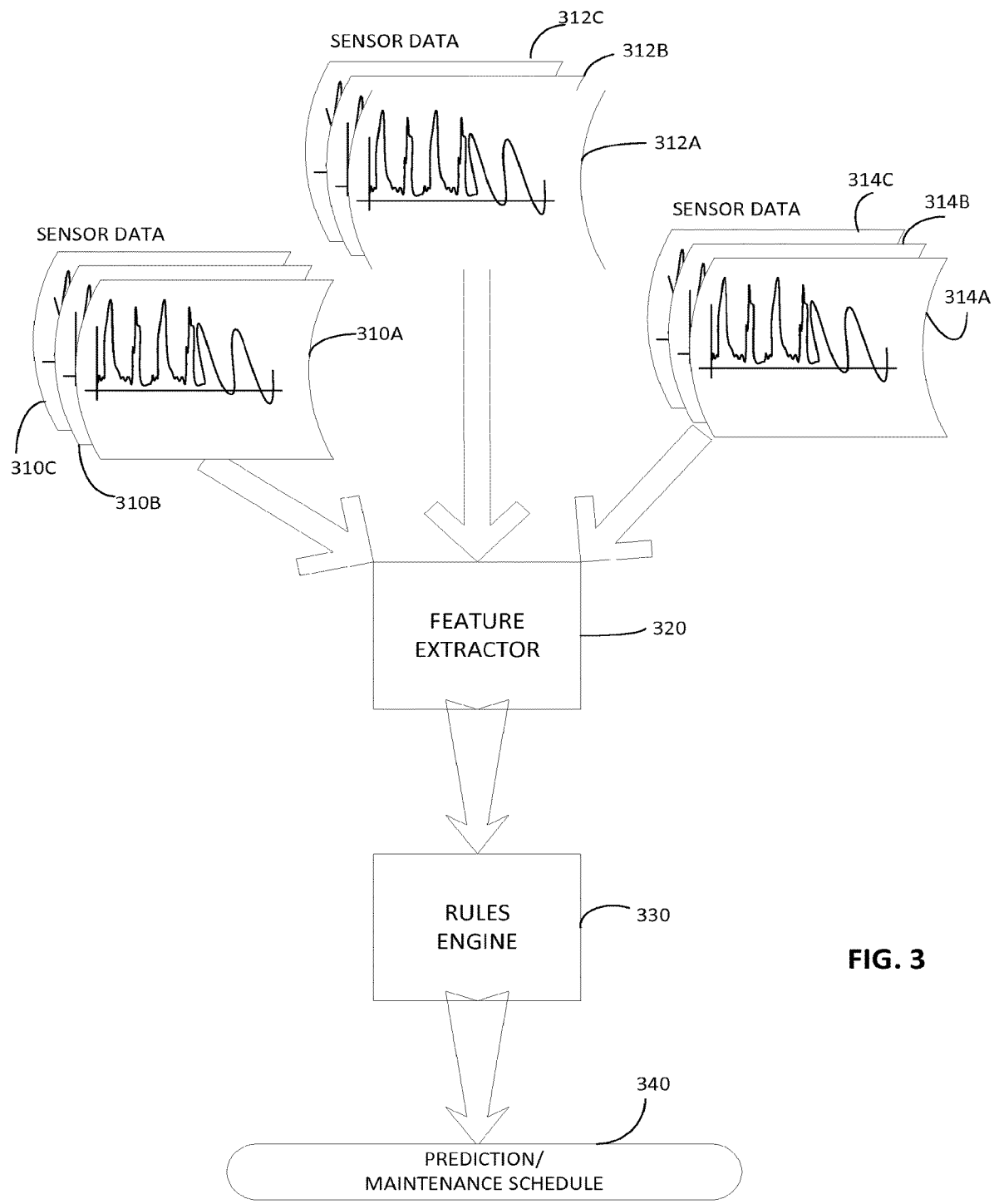
FIG. 3 is a functional block diagram of processing that may be performed on data collected by sensor units that are part of a system for determining at least one condition of one or more power lines needing maintenance, in accordance with some embodiments of the present invention.

Regardless of the specific makeup of the sensor units, FIG. 3 illustrates operation of a system in which multiple sensor units are deployed on line segments. FIG. 3 illustrates data collected from multiple sensor units. In this example, data collected from three sensor units, each containing three sensors of the same type, is illustrated. Data 310A, 310B, and 310C represents data collected from three sensors in a first sensor unit. Data 312A, 312B, and 312C represents data collected from three sensors in a second sensor unit. Data 314A, 314B, and 314C represents data collected from three sensors in a third sensor unit. These data, for example, may represent electrical properties, thermal properties and inertial properties, such as acceleration, on each of the line segments to which a sensor unit is attached.

It should be appreciated that three sensor units, each with three sensors, is a simplified example. In some embodiments, data may be collected from many more sensors (e.g., at least 10, at least 100, at least 500, at least 1000, etc.) deployed throughout a power distribution network. Regardless of the number and type of sensors, the data from the sensors may be routed to a component 320 that performs feature extraction. Component 320 may be implemented within controller 150, within the sensor units, and/or in any other suitable location. In some embodiments, component 320 may be distributed, such that portions of the processing performed by feature extractor component 320 are performed in different computing devices and/or different locations throughout a power line management system.

Regardless of the specific device or devices that perform feature extraction, that processing may lead to identification of features in signals collected at the outputs of sensors. For example, analysis of the output of an accelerometer may lead to identification of features indicating oscillations of a line segment. As another example, analysis of the output of an inclinometer may lead to identification of features indicating sagging of a line segment. As yet further examples, analysis of the output of sensors measuring electrical properties may lead to identification of features indicating power glitches and/or any of numerous other operating states in the power line network.

Regardless of the specific features extracted by component 320, the identified features, alone or in combination with the collected sensor data, may be provided to a further component for analysis to determine a condition indicating a need for maintenance on a power line segment. That need may be a current need or a predicted need for maintenance. In the example illustrated, that analysis may be performed by a rules engine 330.

Rules engine 330 may be programmed in advance with rules for identifying conditions based on sensor data. Though, in some embodiments, rules engine 330 may be configured to accept rules in a format that can be generated by an operator of a network of power lines. In this way, the power line management system may be readily configured for any specific location. As an example, when deployed in a windy environment, additional rules may be added to distinguish conditions attributable to normal wind from conditions caused by a need for maintenance of power lines. When deployed in a snowy location, additional rules that define dangerous conditions due to snow or ice buildup on the power lines may be added.

Regardless of when and how rules are made available to rules engine 330, these rules may be applied to detect conditions such as, but not limited to:
 a) Detection of ice on a conductor. Such a condition may be identified by detecting droop in the conductor based on a measurement from an inclinometer. Detecting such a condition may be important for an operator of a power line network because it can result in total cable or pole/tower failure.
 b) Detection of sag and stretch in the conductor due to excessive heating of the cable due to high current situations, which can result in unwanted contact with vegetation and trees. Such a scenario can create momentary or permanent power outages, or can ruin a cable, and force emergency replacement.
 c) Determination of the effects of wind on the conductor resulting in cable swinging and oscillation, which could result in unwanted contact with vegetation and trees which can create momentary or permanent power outages.
 d) Detection of 'galloping' of cables due to wind. This situation is the result of certain wind conditions (velocity, direction, duration), which can encourage a cable to oscillate at its resonant frequency, and eventually rip itself off the pole/tower, or actually initiate a pole/tower failure.
 e) Detection of the effects of high surge currents due to the violent nature of cables twisting, and lurching under the rapid current rush condition caused by power faults and lightning.
 f) Detection of contact of power line(s) with vegetation such as tree branches and leaves, or other objects.
 g) Detection of contact of power line(s) with wildlife (e.g., squirrels).
 h) Blown fuse on a capacitor bank.

As can be seen from the foregoing examples, rules engine 330 may be configured to generate information 340 to determine conditions requiring maintenance. The maintenance, for example, may be preventative and may include removing sag from a power line or removing obstacles, such as tree limbs from power lines. Though, other preventative actions may relate to operation of the power distribution system. For example, when numerous power lines throughout an area are loaded with snow or ice, an electric utility may plan for multiple power outages. Such planning may include advance preparation for repairs and/or proactively decoupling portions of the power line network to avoid transients on the network when power lines fail to avoid the even greater damage that might be caused by those transients. These and other actions may be taken in response to information 340.

As can also be seen from the foregoing examples, determining conditions that require maintenance may be based on outputs from one or more sensor units, which may be deployed in one or more locations and/or on one or more phases. For example, some conditions may affect many of the power lines in an area. For example, wind or snow and ice buildup is likely to affect many power lines at the same time. Accordingly, such weather-related conditions may be connected using rules that define conditions that might exist on multiple line segments. Overload conditions also are likely to affect multiple line segments, particularly if those line segments form different portions of a single conductor. Accordingly, such conditions may be determined using rules defining conditions that might exist on multiple power line segments.

On the other hand, rules to determine localized conditions may be based on the differences between the outputs of sensors in some locations and/or phases versus others. Additionally or alternatively, rules to determine localized conditions may be based on the differences in output of the same sensor over time. For example, a tree branch contacting a line segment may result in accelerometer measurements with a different magnitude or frequency on that line segment than on other (e.g., nearby) line segments.

One specific example of a condition that may be determined based on outputs from multiple sensor units is a condition of one or more power conditioning components distributed throughout the power distribution system. For example, a condition of one or more capacitor banks installed in the power distribution system may be determined. A capacitor bank may comprise any suitable number of capacitors of any suitable type as the number and type of capacitors in a capacitor bank is not a limitation of aspects of the present invention. A capacitor bank may be used, by some power distribution systems, to compensate for a low power factor where loads on the power distribution system tend to be reactive, such as may result when the loads connected to the power distribution system contain large motors, inductive heaters or other devices that may draw reactive power. The capacitor bank, when connected to the same line near the reactive load can supply reactive power. Thus, the capacitor bank reduces the need for reactive power to be supplied over other lines in the power distribution system leading up to the capacitor bank. Because reactive power passing through a distribution system leads to more losses than real power, using a capacitor bank to compensate for reactive loads increases the overall efficiency of the power distribution system. Though, this efficiency increase is achieved only if the capacitors are connected to the line at the same time as, and in the vicinity of, the reactive load. For that reason, capacitor banks may be distributed throughout a power distribution system and switched, so that they can be connected or disconnected as the load varies to be more or less reactive.

A capacitor bank is often installed on each of multiple conductors in a power line (e.g., on three phases, in which case it is referred to as a three-phase capacitor bank). As such, in some embodiments, multiple sensor units installed on one or more phases of a power line may be used to determine conditions associated with a capacitor bank. Data collected by the multiple sensor units may be used to detect the presence of any problems with the capacitor bank and, for example, may determine whether there is a blown fuse in the capacitor bank.

Abnormal events in a power distribution system, such as lightning strikes, could cause a capacitor bank to rupture, which may require one or more components of the capacitor bank to be replaced and may even cause a fire. For this reason, capacitor banks include one or more fuses. In some instances, a capacitor bank includes a fuse for each conductor to which it is coupled. These fuses may "blow" in response to excessive current in order to protect the capacitor bank and/or other power distribution system components from further danger. It should be appreciated that blown fuses may result from any of numerous types of events including, but not limited to, lightning strikes, near lightning strikes, and the presence of larger than normal harmonics on one or more lines (e.g., larger than normal harmonics in the voltage). Such harmonics may arise for any of numerous reasons and, for example, may be generated from a device or devices at customer facilities or by loose taps on the circuit. A blown fuse, or other failure that prevents a capacitor bank from operating, may mean that the benefits of the capacitor bank are lost. In a three-phase capacitor bank, loss of a capacitor bank on one phase or two phases may create a voltage imbalance, which may increase distribution losses.

As previously mentioned, multiple sensor units may be used to detect a condition in a power distribution system, including a condition associated with a capacitor bank. In particular, the inventors have recognized and appreciated that multiple sensor units may be used to detect a blown fuse or other conditions that renders a capacitor bank ineffective. Accordingly, in some embodiments, multiple sensor units (e.g., three sensor units for a three-phase capacitor bank) may be installed in the power distribution system near the capacitor bank. Each of these sensor units may be configured to measure power factor information. As is known, power factor is indicative of the relative amounts of real and reactive power for the corresponding conductor and may be determined using techniques as are known in the art, including by determining relative timing of peaks in the current and voltage on the line. The sensors may be positioned such that the measured power factors vary based on the amount of reactive power that is being corrected by the capacitor bank. In some embodiments, data to determine condition of a capacitor bank may be obtained from sensors downstream of the capacitor banks However, the data may be obtained from any suitable sensors, and the specific sensor locations selected may depend on the type of power conditioning components for which a condition is being determined.

In some embodiments, a blown fuse in a capacitor bank, or other condition rendering a capacitor bank inoperative, may be detected by using power factor information comprising power factor measurements obtained by multiple sensor units. For example, a blown fuse may be detected by comparing the obtained power factor measurements with previously obtained power factor information. When a fuse in a capacitor bank blows, the corresponding capacitor will not be able to correct the reactive load on the associated conductor and, as such, the measured power factor will be different.

Such a difference may be detected in any suitable way. In some embodiments, the difference may be detected based on a sudden change in power factor as measured on a single phase such that the difference relates to a difference before and after a sudden event. In this case, the comparisons may be made over a relatively short time scale, such as seconds, to detect a sudden change. In some embodiments, a sudden change in power factor may be confirmed as associated with a blown fuse or other catastrophic condition based on comparisons to other sensor measurements. Those sensor measurements may be on different phases of the same line, though comparisons with measurements from other suitable sensors may also be made.

Though, in some embodiments, the power factor measured by a sensor unit may vary over time due to changes in load and controlled switching in the capacitor bank. As a result, in some embodiments, changes in power factor may occur without a sudden change indicating a fault condition associated with a capacitor bank. Thus, in some embodiments, the fault condition may be determined by detecting a change relative to a normal pattern of power factor variations.

To support such a comparison, a sensor unit, or other computerized component in a system such as controller 150 (FIG. 1), may track variations in power factor on the multiple conductors. These variations may be tracked over a period of time of any suitable scale. As an example, a pattern representing daily, weekly, monthly, or annual variations may be detected and stored based on captured measurements.

When a fuse in the capacitor bank blows, the power factor measurements of, or variation or other parameters associated with power factor measurements, may deviate from this pattern by a sufficient amount to allow identification of a fault condition. As such, comparing power factor measurements with previously obtained power factor information may allow for the detection of a blown fuse in a capacitor bank, or other condition in a power conditioning component.

To detect a condition in a power conditioning component, power factor measurements may be evaluated by using any of numerous types of power factor information related to power factor on a phase or multiple phases of a line. For example, power factor information may include one or more power factor measurements obtained over any suitable period of time. In this case, power factor measurements (or a pattern in their variation) may be compared with previously obtained power factor measurements (or a pattern in their variation). As another example, power factor information may include one or more models (e.g., a statistical model, template-based, rule-based or any other suitable type of model) for predicting power factor measurement values on each of one or more phases in a line. In this case, power factor measurements may be evaluated to determine whether they deviate from power factor measurements predicted by the model or models.

Power factor information may be constructed and/or updated in any suitable way. In some instances, as described below with reference to FIG. 11A, power factor information may be created and/or updated based on power factor measurements on each of one or more phases in a line.

Additionally or alternatively, power factor information may be constructed and/or updated based on information about how a power distribution network is controlled. For example, information indicating when one or more capacitor banks are switched may be used to construct a model for predicting power factor measurements.

Figure 11A:
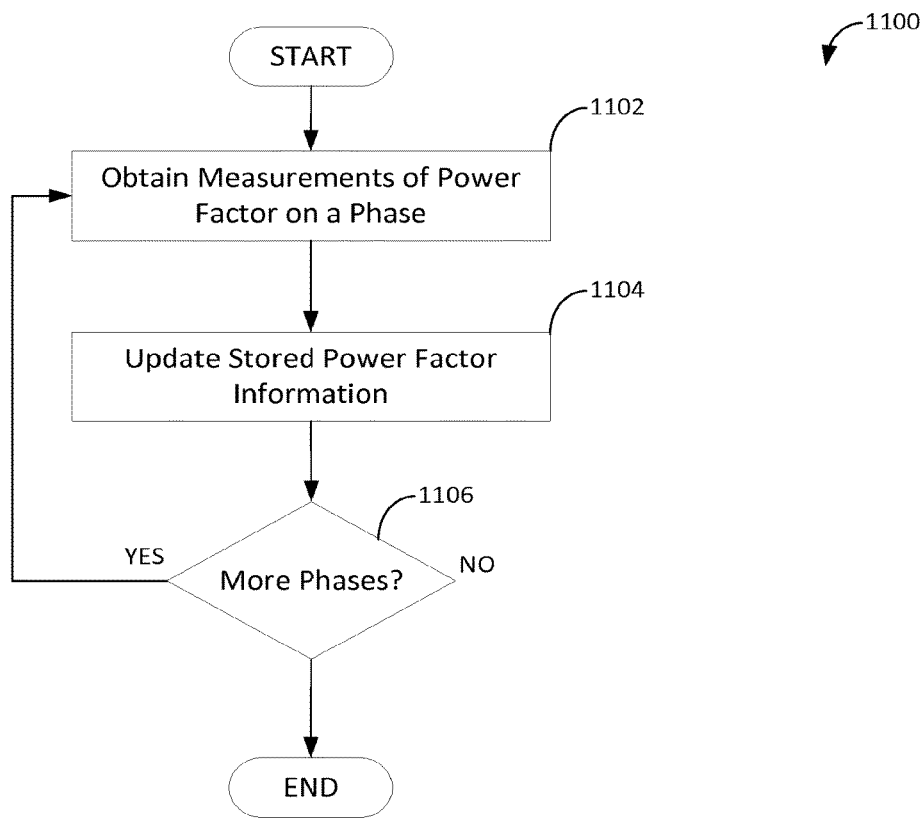
FIG. 11A is a flowchart of an illustrative process for obtaining power factor information, in accordance with some embodiments of the present invention.

FIG. 11A shows illustrative process 1100 for obtaining and updating power factor information. Process 1100 may be executed by controller 150 described with reference to FIG. 1 or any other component or components of a monitoring system for monitoring a power distribution network (e.g., one or more sensor units and/or nay other suitable computing devices).

Process 1100 begins in act 1102, where power factor measurements on a phase are obtained. Such measurements may be obtained from a sensor unit configured to monitor the particular phase. To this end, the sensor unit may obtain one or multiple power factor measurements and/or may obtain one or multiple measurements of other quantities from which power factor measurements may be computed.

Next, process 1100 proceeds to act 1104, where the measured power factor may be used to update stored power factor information. This may be done in any suitable way. For example, the obtained power factor measurements may be stored. As another example, one or more patterns may be derived based at least in part on the power factor measurements. As yet another example, when stored power factor information comprises a model for predicting power factor measurement values, such a model may be updated based on the obtained power factor measurements.

Next, process 1100 proceeds to decision block 1106 where it is determined whether a line comprises other phases for which power factor measurements are to be obtained. If it is determined that there are no other phases for which power factor measurements are to be obtained, process 1100 completes and updated power factor information may be used to detect a condition of one or more power conditioning components in a power distribution system as described below with reference to FIG. 11B.

On the other hand, if it is determined that there are other phases for which power factor measurements are to be obtained, process 1100 loops back to act 1102 and power factor measurements for the other phase may be obtained. These measurements may then be used to update the stored power factor information. The process loops in this manner until power factor measurements from all the phases (for which power factor measurements are to be obtained) are obtained and used to update the stored power factor information.

Figure 11B:
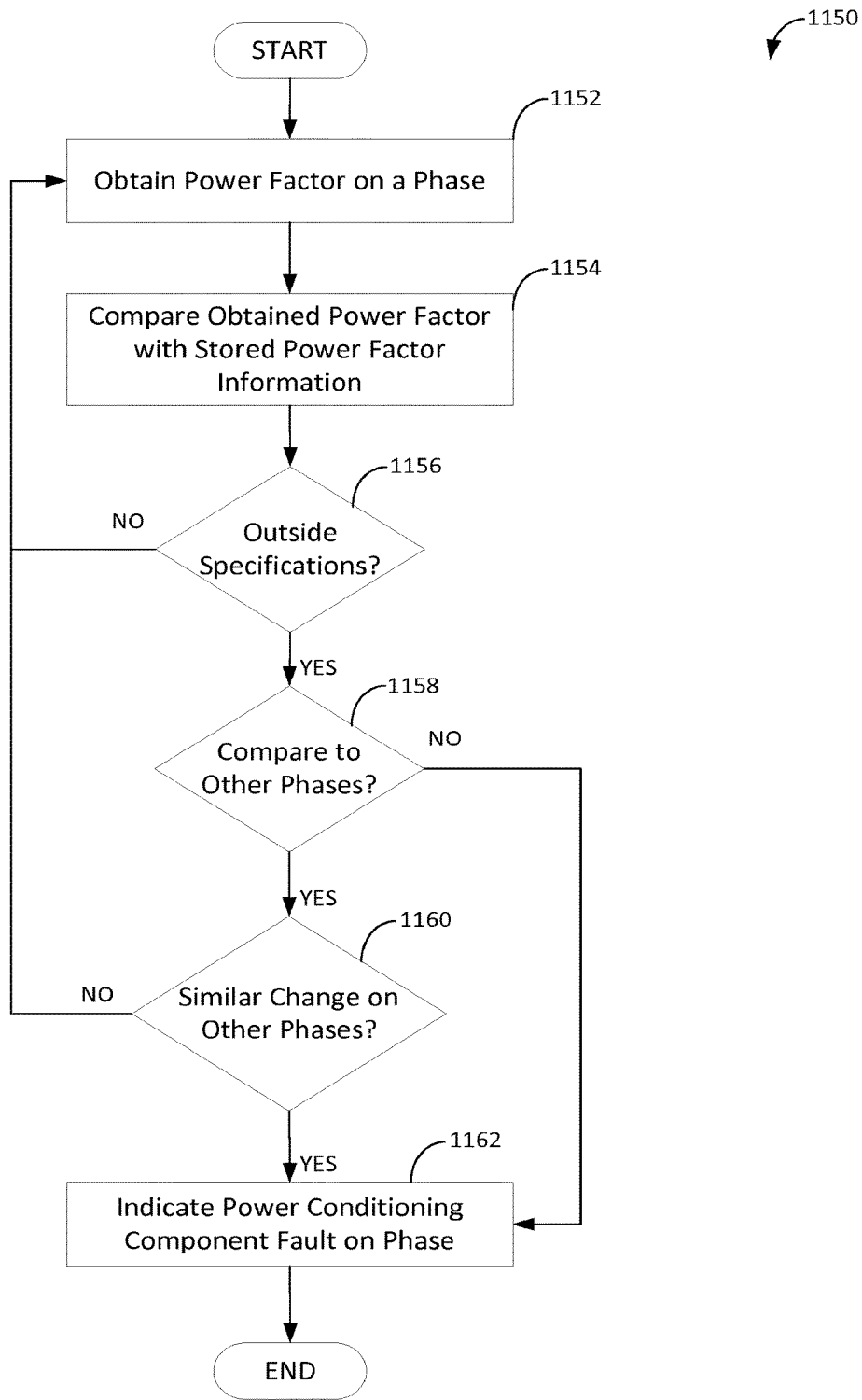
FIG. 11B is a flowchart of an illustrative process for determining conditions associated with power conditioning components, in accordance with some embodiments of the present invention.

FIG. 11B shows illustrative process 1150 for determining conditions associated with power conditioning components based on stored power factor information. Process 1150 may be used for determining any of numerous types of conditions and, for example may be used for identifying a power conditioning component fault on a phase of a line. Similar to process 1100, process 1150 may be executed by controller 150 described with reference to FIG. 1 or any other component or components of a monitoring system for monitoring a power distribution network (e.g., one or more sensor units and/or nay other suitable computing devices).

Process 1150 begins in act 1152 where one or more power factor measurements on a phase are obtained. The measurement(s) may be obtained in any suitable way and, for example, may be obtained from a sensor unit configured to monitor the phase. To this end, the sensor unit may obtain one or multiple power factor measurements and/or may obtain one or multiple measurements of other quantities from which the power factor measurement(s) may be computed.

Next, process 1150 proceeds to act 1154 where the obtained power factor measurement(s) are compared with stored power factor information. This may be done in any suitable way. For example, a difference between measurements obtained in act 1152 and previously obtained power factor measurements may be computed. As another example, a pattern of variation in power factor measurements obtained in act 1152 may be compared with one or more patterns in previously obtained power factor measurements. As yet another example, power factor variations on one phase may be compared with power factor variations on one or more phases to determine whether a power conditioning component has a fault condition. As a specific example, variations in power factor on one phase that are correlated in time with—but larger than—variations on another phase, may indicate a fault. As yet another example, power factor measurements obtained in act 1152 may be evaluated by using a model for predicting power factor measurement values. Though, it should be recognized that these are only illustrative examples of how power factor measurements may be compared with stored power factor information and that such a comparison may be performed in any other suitable way.

The results of the comparison may then be used to determine whether a power conditioning component has a fault condition. To this end, process 1150 next proceeds to decision block 1156 to determine whether the result of the comparison performed in act 1154 indicates that the power factor measurements obtained in act 1152 are outside of specifications. This may be done in any of numerous ways depending on the type of comparison that was performed in act 1152. For example, when the difference between power factor measurements obtained in act 1152 and previously obtained power factor measurements lies outside of a specified range, it may be determined that the power factor measurements obtained in act 1152 are outside of specifications. Such a determination may also be made when a pattern of variation in power factor measurements obtained in act 1152 deviates from one or more patterns in previously obtained power factor measurements by more than a specified amount. Such a determination may also be made if the power factor measurements obtained in act 1152 sufficiently deviate from power factor measurements predicted by a model. Many other ways of determining whether obtained power factor measurements are outside of specifications may be used, as aspects of the present invention are not limited in this respect.

If it is determined, in decision block 1156, that the power factor measurements are not outside of specifications, process 1150 loops back to act 1152 to continue monitoring power factor on the phase. On the other hand, if it is determined that the power factor measurements are outside of specifications, process 1150 proceeds to decision block 1158, where it is determined whether power factor measurements associated with other phases should be considered in order to determine whether or not there is a power conditioning component fault. If it is determined that no such comparison is needed, process 1150 proceeds to act 1162 where an indication of a power conditioning component fault is provided and process 1150 completes.

Otherwise, process 1150 proceeds to decision block 1160, where it may be determined whether power factor measurements associated with other phases are also outside of specifications. This may be done in any suitable way and, for example, may be done using the same techniques as described with respect to act 1154. As such, measurements from multiple phases may be considered to determine whether there is a fault associated with a power conditioning component on a phase.

If it is determined that power factor measurements on one or more other phases are not outside of specifications, process 1150 loops back to act 1152 and monitoring continues. However, if power factor measurements on other phases also lie outside of specifications, process 1150 proceeds to act 1162, where an indication of a power conditioning component fault is provided and process 1150 completes.

As previously mentioned, multiple sensors may be used not only to determine a condition of one or more power lines (e.g., detect a blown fuse in a capacitor bank, detect animal contact, any of the other previously mentioned conditions, etc.), but may also be used to identify information indicative of a location of the determined condition. In some embodiments, for example, multiple sensors may be used to obtain a distance to a location of the determined condition. One such technique for identifying a distance to the location of a ground fault is described in greater detail below with reference to FIGS. 4A-4C. Though, it should be appreciated that these techniques are not limited to identifying distance to the location of ground faults and may be used to identify the distance to any of numerous other types of conditions of power lines.

Figure 4A:
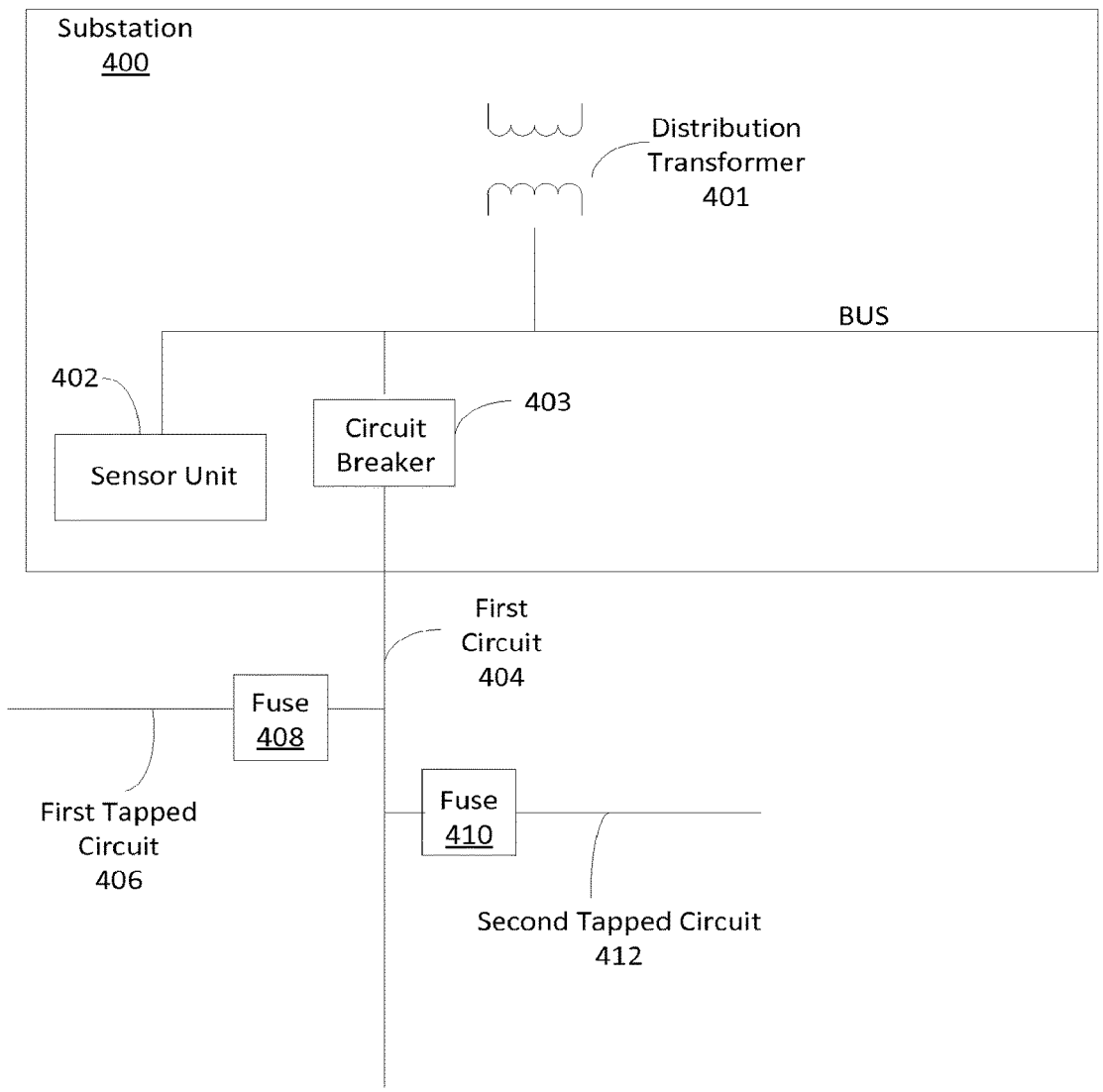
FIGS. 4A and 4B illustrate conventional approaches to identifying a distance to a location of a ground fault in a power distribution system.
Figure 4B:
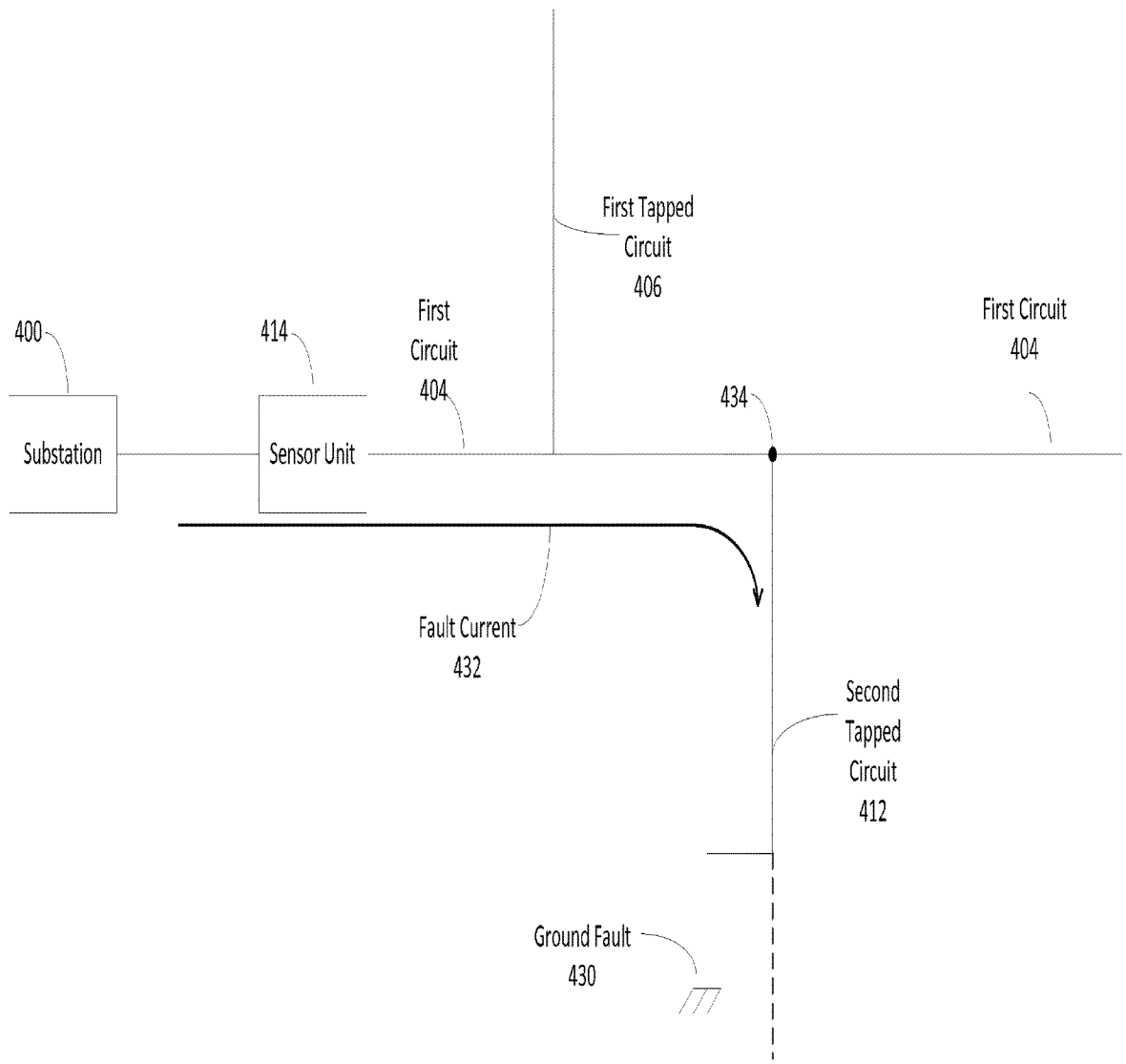

FIGS. 4A and 4B illustrate conventional approaches to identifying a distance to a location of a ground fault in a power distribution system. As described below, these conventional approaches use only a single sensor unit.

FIG. 4A illustrates a conventional electrical distribution circuit comprising first circuit 404 carrying electrical power from a power source to one or more tapped (sometimes referred to as "lateral") circuits branching off of the first circuit. In the illustrated embodiment, first circuit 404 carries electrical power from substation 400 to first tapped circuit 406 and to second tapped circuit 412. The electrical distribution circuit further comprises distribution transformer 401 and circuit breaker 403.

First circuit 404 may be any suitable type of circuit and, as such, may comprise multiple conductors. For example, first circuit 404 may comprise three conductors with each conductor carrying current having a different phase. First circuit 404 may carry voltages in the range of 4-35 kV with normal load currents up to 600 amperes. First circuit 404 may also comprise a smaller ground conductor.

Each tapped circuit branching off first circuit 404 may be fused in order to protect first circuit 404 if a ground fault were to occur in the tapped circuit. For example, in the illustrated embodiment, first tapped circuit 406 and second tapped circuit 412 are fused by using fuses 408 and 410, respectively. Fuses 408 and 410 may be mechanical breakers, solid state breakers or any other suitable types of fuses as known in the art.

When a ground fault occurs on a tapped circuit, the distance to the location of the ground fault may be estimated as described below. First, it should be observed that, as shown in FIG. 4B, when a low impedance ground fault 430 occurs on a tapped circuit, such as second tapped circuit 412, a fault current 432 flows from substation 400, down first circuit 404, and then down tapped circuit 412 to ground fault 430. Fault current 432 may last only last a few cycles, since fuse 410 in tapped circuit 412 may blow in response to fault current 432 flowing in second tapped circuit 412.

When fault current 432 is flowing, sensor unit 402 disposed at substation 400 (as shown in FIG. 4A) or sensor unit 414 coupled to first circuit 404 between substation 400 and the second tapped circuit 412 (as shown in FIG. 4B) may measure voltage and current at the point where that sensor unit (404 or 414) is connected to the electrical distribution circuit. A short circuit impedance of the ground fault 430 may then be obtained from these measurements, as known in the art. The distance to the location of ground fault 430 from the sensor unit (404 or 414) may then be estimated based on the obtained short circuit impedance and the impedance per foot of the conductors forming first circuit 404 and second tapped circuit 412.

The inventors have recognized and appreciated that the above-described conventional approach of determining a distance to the location of a ground fault suffers from several shortcomings. For example, the above-described approach relies on an assumption that the impedance of conductors in the first circuit is the same as the impedance of the conductors in the tapped circuits. However, impedance of these conductors may be quite different. This may be due to the fact that different tapped circuits may comprise conductors having different lengths and diameters. As such, using the above-described technique, based on measurements obtained by one sensor unit, may lead to inaccurate estimates of distance to a location of a fault.

The inventors have recognized that using measurements obtained by multiple sensor units may be used to overcome some of the above-described shortcomings of conventional techniques for identifying a distance to a location of a fault. Accordingly, in some embodiments, multiple sensor units may be used to collect measurements that may be used to identify a distance to a location of a condition in the power distribution system.

In some embodiments, a distance to a physical location of a condition (e.g., a ground fault, metallic fault, any other type of condition causing a fault current, etc.) in the power distribution system may be obtained by processing one or more measurements obtained by at least one sensor unit upstream of the location of the condition together with one or more measurements obtained by at least one sensor unit downstream of the location of the condition. For example, a current measurement obtained by a sensor upstream of a fault may be processed together with a voltage measurement obtained by a sensor downstream of the fault in order to identify an impedance of a tapped circuit in which the condition is occurring and, in turn, identify the distance to the physical location of the fault based on the computed impedance. One such arrangement is illustrated in FIG. 4C, which illustrates using multiple sensor units to identify a distance to a ground fault in a power distribution system.

Figure 4C:
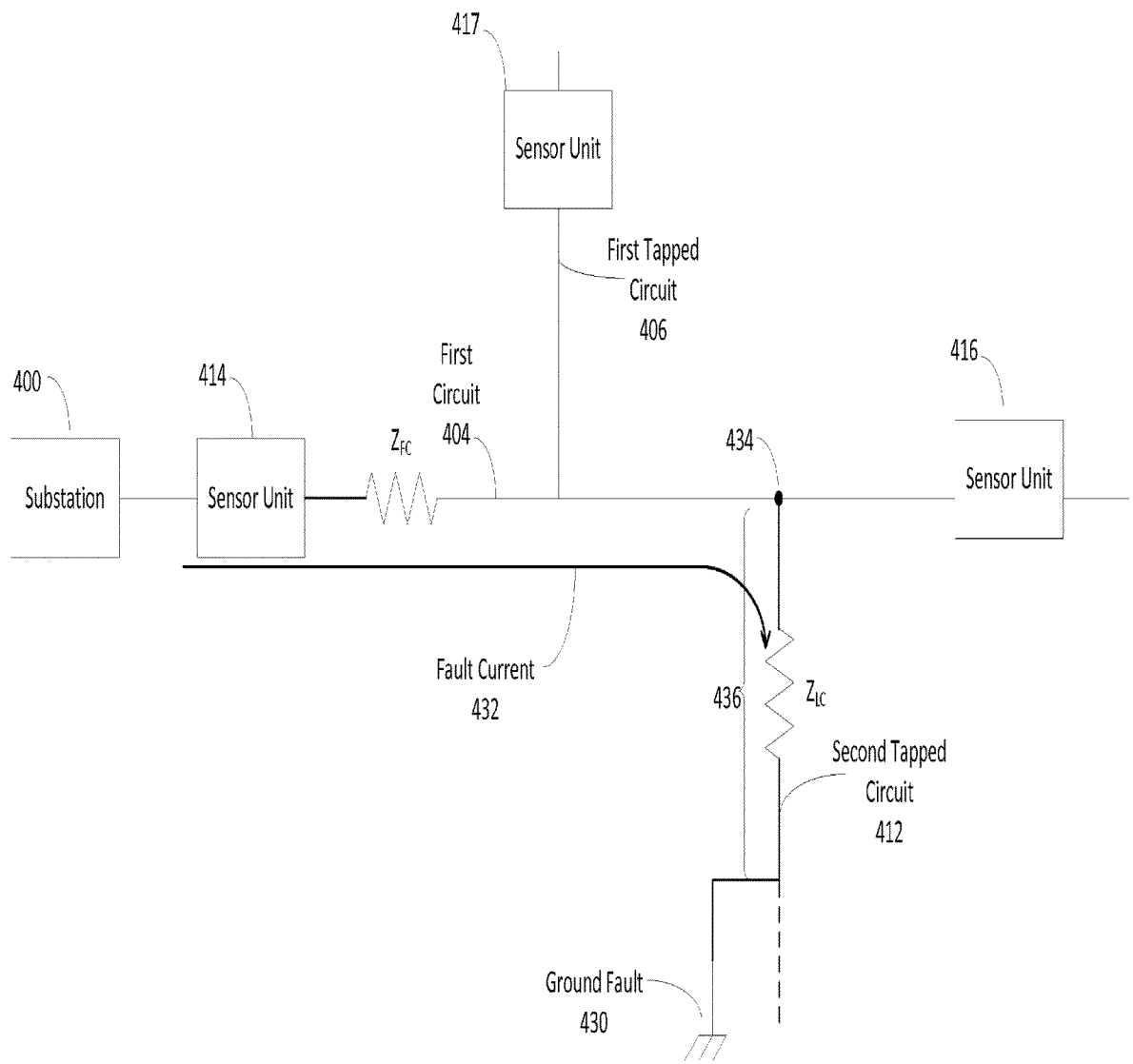
FIG. 4C illustrates using multiple sensor units to identify a distance to a location of a condition in a power distribution system, in accordance with some embodiments of the present invention.

FIG. 4C shows the electrical circuit of FIG. 4B, with the addition of a second sensor unit, sensor unit 416, coupled to first circuit 404 downstream of the tapped circuit where ground fault 430 is occurring (second tapped circuit 412). Though, it should be recognized that, in some embodiments, more than two sensor units may be deployed in the power distribution network as the number of sensor units deployed is not a limitation of aspects of the present invention. For example, in the illustrated embodiment, a third sensor unit, sensor unit 417, is shown as being deployed on first tapped circuit 406.

Sensor unit 416 may be configured to obtain any of numerous types of measurements at the point where it is connected to the first circuit. For example, sensor unit 416 may be configured to obtain one or more voltage measurements. By obtaining one or more voltage measurements sensor unit 416 may be configured to detect voltage sag on second tapped circuit 412, where ground fault 430 is occurring, when fault current 432 is flowing. Because sensor unit 416 is downstream of second tapped circuit 412, little or no current may be detected by sensor unit 416 during the fault. As a result, the voltage measured by sensor unit 416, denoted by $V_{FAULT}$, may be substantially the voltage present at the junction of first circuit 404 and second lateral circuit 412 (indicated as point 434 in FIG. 4C).

Sensor unit 414 may also be configured to obtain one or more measurements. For example, sensor unit 414 may be configured to measure voltage and/or current at the point where it is connected to first circuit 404. These measurements may be used to detect whether a fault may be occurring and/or to obtain a measurement of the fault current, denoted by $I_{FAULT}$. In the illustrated embodiment, current measurements obtained by sensor unit 414 may approximate the fault current because, in a case of a ground fault, the fault current is greater than other current. However, in other embodiments, current measurements obtained by sensor unit 414 may be used together with currents measurements obtained by one or more other sensor units (e.g., sensor unit 417) to obtain a measurement of the fault current. Though, it should be recognized that other approaches may be employed to determine whether a fault may be occurring. For example, in response to a triggering event (e.g., a tripping of a circuit), recently collected measurements may be analyzed to determine whether a fault is present.

The measurements obtained by sensor units 414 and 416 may be used together in order to identify a distance to the location of ground fault 430. First, it should be appreciated that the impedance $Z_{LC}$ of second tapped circuit 412 may be determined by using the voltage $V_{FAULT}$, measured by sensor unit 416 during the voltage sag, and the current $I_{FAULT}$, measured by sensor unit 414 during the voltage sag. Impedance $Z_{LC}$ is the impedance at junction 434 between circuit 404 and second tapped circuit 412. In particular, assuming that the voltage is zero at the point where ground fault 430 is occurring, it may be deduced that $V_{FAULT}$ is the voltage impressed across the impedance $Z_{LC}$ of second tapped circuit 412. Additionally, assuming that current $I_{FAULT}$ flows in the length of first circuit 404 between sensor unit 414 and the junction 434, and in second tapped circuit 412, the impedance $Z_{LC}$ may be determined according to $Z_{LC}=V_{FAULT}/I_{FAULT}$. Though, it should be appreciated that the impedance $Z_{LC}$ may be computed using measurements obtained by multiple sensors in any other suitable way.

Next, the distance to the location of ground fault 430 may be determined by using the impedance $Z_{LC}$ of second tapped circuit 412 and a representative impedance per unit length, (e.g., impedance per foot, per meter, per mile, etc.) of the conductors in second tapped circuit 412. As one example, distance 436 (in miles) from junction 434 to the location in second tapped circuit 412 where ground fault 430 is occurring may be determined according to the ratio between $Z_{LC}$ and the impedance per mile of second tapped circuit 412. This way multiple sensor units may be used to obtain an estimate of a distance to a location of a condition of a power line in a power distribution system.

It should be appreciated that such distance information may be combined with other information about the power distribution system to identify the location of a condition in the power distribution system. For example, information about the layout of the power lines in the power distribution system together with a measure of distance to the location of a fault in the system may be used to identify the physical location of the fault. Such information may be valuable to expedite any maintenance operations that may be performed or scheduled to be performed in response to the detected fault.

Accordingly, multiple sensor units may be used to detect conditions and obtain information about such conditions based on measurements collected at different locations in the power distribution system. Such measurements may be used together in any suitable way including, but not limited to, any of the above-described ways for using measurements collected by multiple sensor units. In some instances, measurements may be correlated in any suitable way that allows measurements obtained by multiple sensors to be used together in order to determine the presence and/or location of one or more conditions. For example, in some embodiments where multiple sensors may not be synchronized or otherwise operating with respect to a common reference time, measurements may be correlated by using a shift-invariant transformation as described below with reference to FIG. 5. Though, measurements may be correlated in any other suitable way that allows measurements obtained by multiple sensors to be used.

In scenarios in which a shift invariant transform is used, the correlation between sensors may be achieved without need for registering data signals in time. Rather, the transform coefficients from data sets representing a time series of outputs from each sensor may be processed together. Processing together may entail any suitable logic, such as determining whether the same feature is detected in each set of transform coefficients, or determining whether two different features are present in each set of transform coefficients or determining whether a feature is present in one set and absent in the other.

Accordingly, in some embodiments, correlations between measurements of different type may be reflected in the rules. For example, rules based on correlations between inertial, electrical, and thermal measurements from the same sensor unit may be useful in predicting sag. As a specific example, a high incline measurement, correlated with a large measured current and a high temperature measurement, may indicate significant sag due to overload. As another specific example, a voltage transient measured at multiple sensors in combination with sensor units reporting a high degree of inclination, may indicate that one or more line segments has sagged to the point of breaking.

Figure 5:
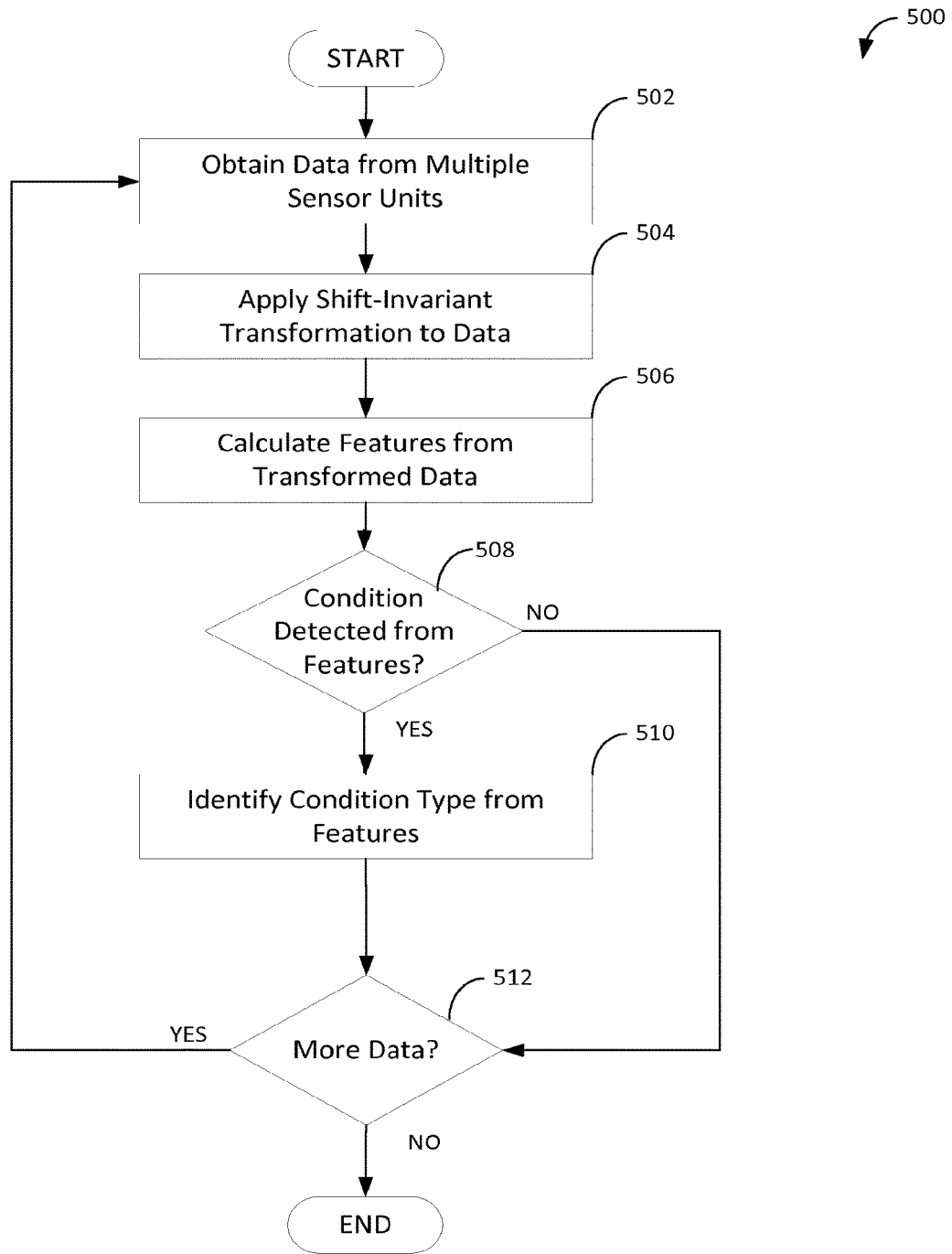
FIG. 5 is a flowchart of an illustrative process for determining at least one condition of one or more power lines needing maintenance, in accordance with some embodiments of the present invention.

Accordingly, measurements collected by multiple sensor units may be used to determine one or more conditions requiring power line maintenance. This may be done using any suitable techniques. One such technique is illustrated in FIG. 5, which is a flowchart of illustrative process 500 for determining one or more conditions requiring power line maintenance. Process 500 may be performed by any suitable computing device or devices such as controller 150 described with reference to FIG. 1.

Process 500 begins in act 502, where data may be obtained from multiple sensor units. The data may be obtained from multiple sensor units directly and/or indirectly and by using any suitable communications medium. For example, the data may be obtained in any of the previously described ways including, but not limited to, receiving the data wirelessly or by using one or more power lines. The data may be obtained from any suitable number of sensor units, as aspects of the present invention are not limited in this respect.

The obtained data may comprise measurements collected by multiple sensor units deployed within a power distribution network. As such, the obtained data may comprise measurements collected by any of numerous types of sensors including, but not limited to, any of the previously described types of sensors. Additionally, obtained data may comprise any information added to data by tagging the data before the data is received in act 502. Such information may indicate the power line segment or segments for which the data was collected, information about the sensor units that collected the measurements including their locations, times when the data was collected, parameters indicating how the data may have been processed prior to its being received in act 402, and/or any other suitable information.

Next, process 500 proceeds to act 504, where data obtained from multiple sensor units may be processed in order to take into account differences in times when the data were collected by the multiple sensor units. In some embodiments, data received from multiple sensor units may be transformed by using a shift-invariant transformation. Data received from each sensor unit may be transformed by the application of the shift-invariant transformation to obtain one or more transform coefficient values.

Applying a shift-invariant transformation to data obtained from multiple sensor units may result in a correspondence between transform coefficient values calculated from the obtained data. For example, data obtained from sensor A may be transformed by applying a shift-invariant transformation to obtain one set of transform coefficient values and data received from sensor B may be transformed by applying the same shift-invariant transformation to obtain another set of transform coefficient values. These transformations result in a correspondence between transform coefficient values obtained from data collected by sensor A and transform coefficient values obtained from data collected by sensor B. This correspondence may exist even if the data for sensor A and sensor B may not be synchronized. As a specific example, the shift-invariant transformation may be a wavelet transformation and each transform coefficient value may be obtained by applying the wavelet transformation to the data is associated with a time and a resolution (sometimes termed "scale"). In such an embodiment, a transform coefficient value computed from data obtained by sensor unit A and associated with a particular time and resolution may correspond to a transform coefficient value computed from data obtained by sensor unit B and associated with the same time and resolution. Though, it should be appreciated that the above-described example involving two sensor units is merely exemplary, that data obtained from more than two sensor units may be correlated, and that correspondences among more than two sets of transform coefficient values may be identified.

The shift-invariant transformation may be any suitable translation-invariant transformation such that the same transform coefficient values are obtained by applying the transformation to data collected by a sensor unit or by applying the transformation to any suitable translation of these data. A translation-invariant transformation may be used to remove effects of any time delays associated with when different sensors may have collected data reflecting the same condition or conditions in the power distribution network. Such delays may result from the sensors being located at different locations within the power distribution network, propagation delays, processing delays, and/or any other numerous factors.

Any suitable shift-invariant transformation may be used. In some embodiments, as previously mentioned, any suitable shift-invariant multi-resolution transformation known in the art may be used such as, but not limited to, the stationary wavelet transform, the continuous wavelet transform, or any of their variants. It is contemplated that applying the shift-invariant multi-resolution transformation may comprise applying any of these or any other translation-invariant transformations. Any of these transformations may be implemented as known in the art, as the precise way the shift-invariant transformation is implemented is not a limitation of aspects of the present invention.

It should be appreciated that applying a multi-resolution transformation to data may produce transform coefficient values associated with multiple resolutions. Transform coefficient values associated with the resolutions may be used to provide a sequence of coarse-to-fine representations of the data. For example, at least some of the obtained transform coefficient values may be associated with a coarse resolution and, as such, represent coarse characteristics of the data. In addition, at least some of the other obtained transform coefficient values may be associated with a finer resolution and, as such, represent finer characteristics of the data.

Figure 6A:
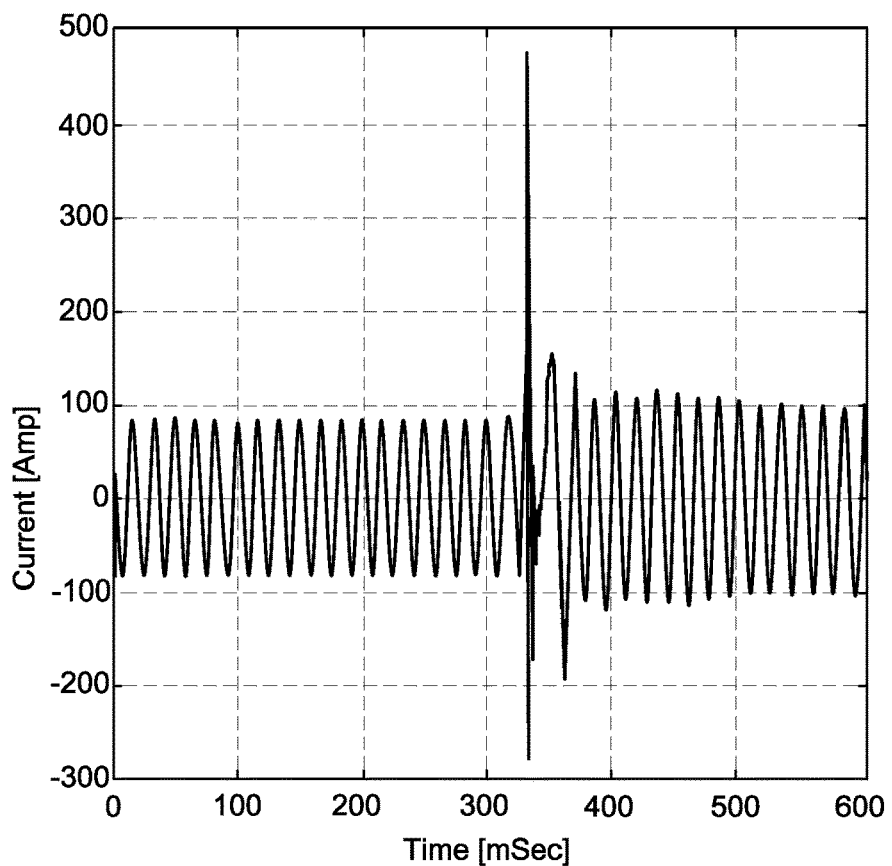
FIGS. 6A-6D show example data collected by a sensor unit and the associated multi-resolution views of the data, in accordance with some embodiments of the present invention.
Figure 6B:
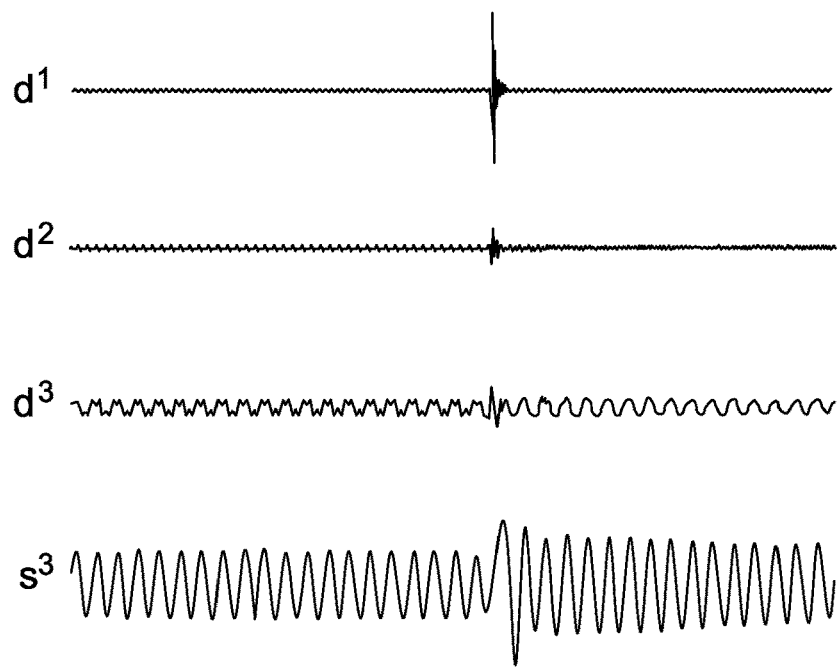
Figure 6C:
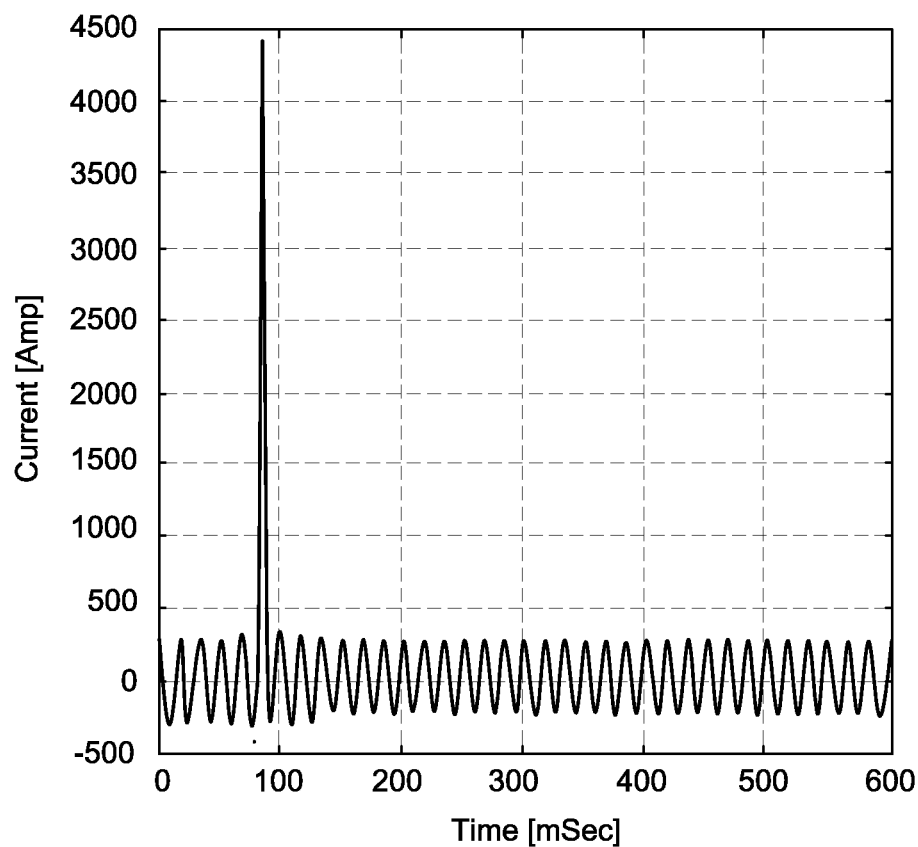
Figure 6D:
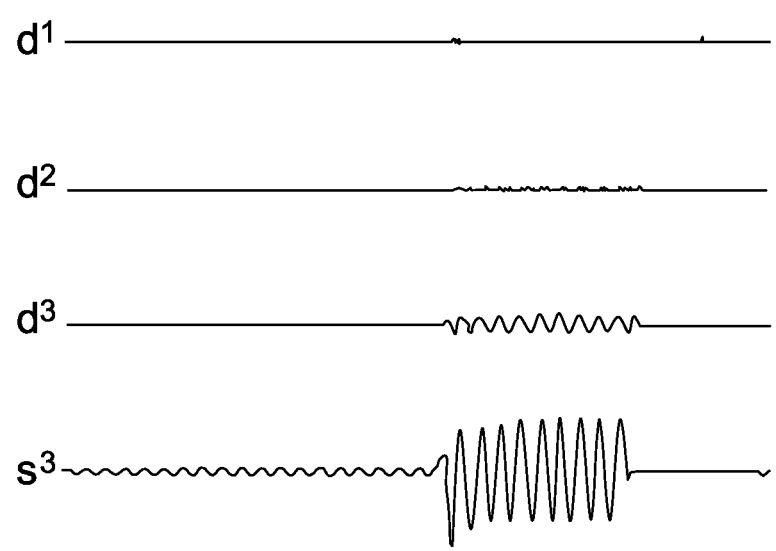
Figure 7:
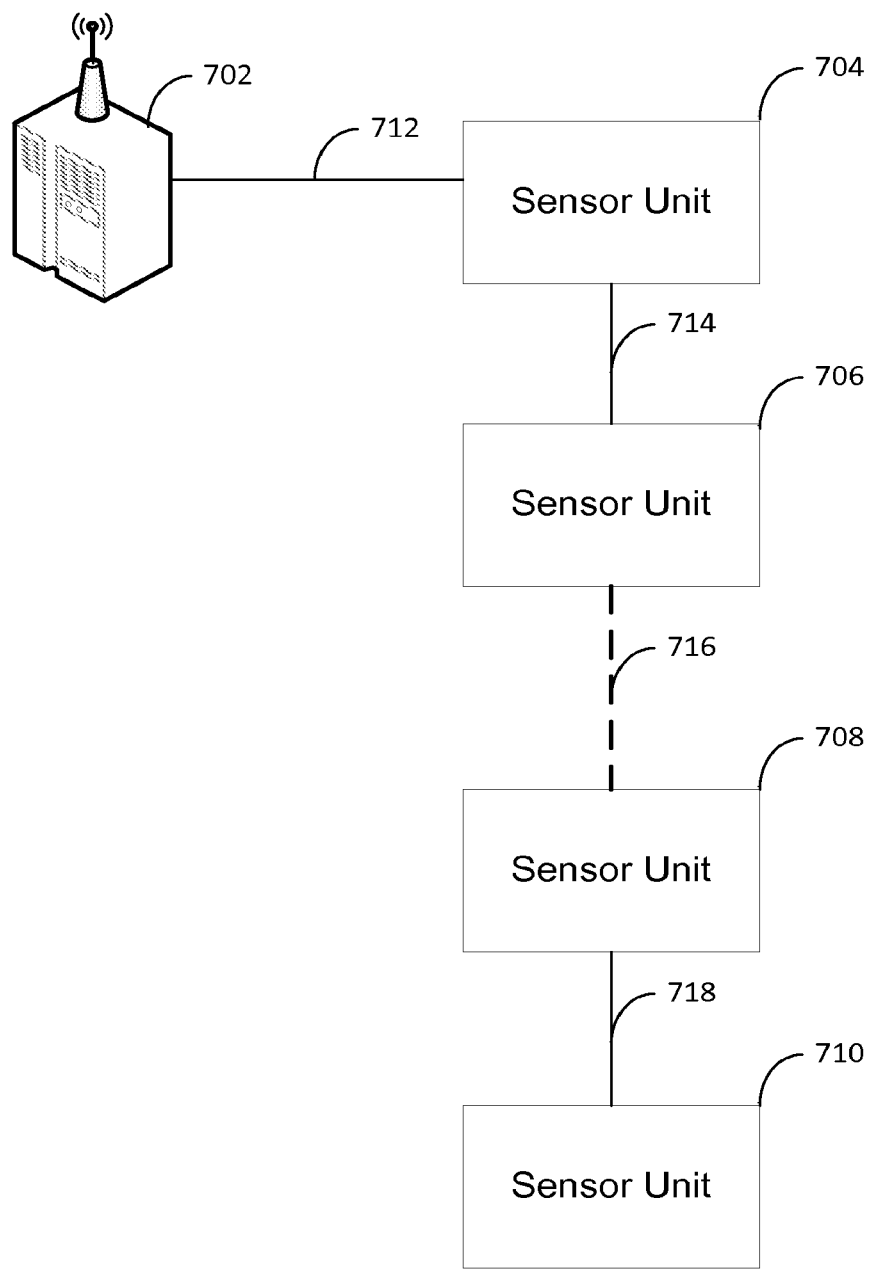
FIG. 7 shows an illustrative configuration of multiple sensor units that may be used to determine at least one condition of one or more power lines needing maintenance, in accordance with some embodiments of the present invention.

As a specific non-limiting example, approximately 600 milliseconds of data were collected by a sensor unit during a time when a falling tree branch came into temporary contact with a power line, as shown in FIG. 6A. The data is a time series of measurements of an electrical property (e.g., current, voltage, etc.) with a transient in the measured property, associated with the tree contact, occurring at about 325 milliseconds. FIG. 6B shows the associated multi-resolution representation of the signal shown in FIG. 6A, obtained by applying the stationary wavelet transform. In particular, the transform coefficient values obtained by applying the stationary wavelet transform to the data are associated with one of four resolution levels. FIG. 6B shows reconstructions of the data obtained from each of the four groups of transform coefficient values (e.g., by applying the inverse stationary wavelet transform). As can be observed, the top reconstruction (labeled $d^1$) is the reconstruction obtained from transform coefficient values associated with the coarsest resolution and indicates the presence of the transient associated with the contact between the tree and the power line. On the other hand, the bottom reconstruction (labeled $s^3$) is the reconstruction obtained from transform coefficients associated with the finest resolution and indicates the presence of oscillations in the measured electrical property. As discussed in more detail below, patterns in transform values may be used not only to determine the presence of a condition, but also to identify the type of the condition. Yet another example of data and its multi-resolution representation is shown in FIGS. 6C-6D. Though, it should be recognized that the number of resolutions is not limited to four and that a multi-resolution transformation may produce transform coefficient values associated with any suitable number of resolutions, as aspects of the present invention are not limited in this respect.

Next, process 500 proceeds to act 506, where one or more features for determining one or more conditions in the power distribution network may be obtained from the data received in act 502. The features may be calculated for data received from one or more sensor units. In some embodiments, the features may be calculated for each sensor unit from which data were obtained by using the data received from that unit, while in other instances, the features may be calculated from data obtained by a subset of the sensor units from which data were obtained.

The features may be calculated in any suitable way. In some embodiments, including those described with reference to process 500 and its variants, the features may be obtained from the transform coefficient values calculated in act 504 of process 500. However, in other embodiments, such as those described below with reference to FIG. 9, the features may be obtained from the received data directly rather than from any transform coefficient values obtained from the data. It should also be recognized that, in some embodiments, features may be obtained from information with which the received data may be tagged.

Any of numerous types of features may be obtained from transform coefficient values. Features may be calculated using any suitable function or functions of the transform coefficient values. For example, an energy of a set of one or more transform coefficient values may be used as a feature. Such an energy may be computed in any suitable way and, for example, may be computed using any energy function known in the art such as the square root of the sum of squares of the coefficient value magnitudes or by using any other suitable norm function known in the art.

It should be appreciated that such an energy may be computed for any suitable set of coefficients and, for example, may be computed for a set of transform coefficient values associated with a particular resolution. For instance, in the non-limiting example shown in FIG. 6B, an energy may be computed for each of the four resolutions using some or all of the transform coefficient values associated with that resolution. As another example, an energy may be computed for any suitable set of coefficients within a window centered on an identified point. For example, an energy may be computed for a set of transform coefficients values $\{d_i^1\}$ at resolution 1 according to:

$$\sqrt{\sum_{i=K-n}^{K+n} |d_i^l|^2}.$$

where K is the identified point and n is a positive integer associated with the length of a window centered around the identified point. The identified point K may be used as the reference point for correlating signals associated with the same event in the power distribution network and is sometimes called the fault inception point.

The fault inception point may be identified in any of numerous ways and, in some embodiments, may be identified as a point at which a signal falls outside of a range so that deviations in the signal may be identified. Such deviations may be due to normal variations in a power distribution network (e.g., due to switching, relays, capacitor banks, etc.) or may be due to a fault in the network. One or more inception points may be computed for a signal. It should be appreciated that a fault inception point may be computed for any type of data collected by a sensor unit including, but not limited to, data collected by any one of the previously-described sensors that a sensor unit may contain.

In some embodiments, location of the fault inception point within a period of a signal (e.g., the power signal) may be identified. This location is referred to as a fault inception angle and is another feature that may be used to to determine one or more conditions in a power distribution network. For example, a fault inception angle close to 90 degrees may be indicative that the fault associated with the corresponding fault inception point is a contact fault (e.g., due to contact between a power line segment and an animal or an object).

It should be recognized that correspondences in sets of transform coefficient values (each set associated with data received from a particular sensor unit), resulting from application of the shift-invariant transformation applied in act 504, imply an association among features obtained from corresponding sets of feature values. For example, an energy calculated from a set of transform coefficient values (obtained from data received from one sensor unit) is associated with another energy calculated from a corresponding set of transform coefficient values (obtained from data received from another sensor unit). As such, multiple features derived from data collected by multiple sensors may be used together in order to determine a condition in the power distribution network as further detailed below. For example, at least one fault inception point and at least one fault inception angle may be computed for each multiple sets of corresponding transform coefficients, where each set of coefficients is obtained from data collected by a different sensor unit.

Next, process 500 proceeds to decision block 508, where the presence of at least one condition in the power distribution network requiring maintenance may be determined by using the features obtained in act 506. The presence of at least one condition in the power distribution network may be determined in any suitable way using some or all of the features obtained in act 506.

In some embodiments, a feature obtained from data received from a single sensor unit may be used to determine the presence of a condition in the power distribution network requiring maintenance. This may be done in any suitable way using any suitable pattern recognition, pattern classification, rule-based and/or other techniques. For example, a feature may be represented by a single numeric value, such as is achieved when energy in multiple coefficients is summed. When a value for a feature falls within a range of values, the presence of a condition requiring maintenance may be determined. Such a range of values may be specified prior to the execution of process 500 or may be dynamically specified. As a specific non-limiting example, when the energy of a set of transform coefficient values exceeds a threshold, the presence of a condition requiring maintenance may be determined. Though, a range of values may be specified in any suitable way, including by indicating a threshold representing a lower limit or values, even if not contiguous, that are included in or excluded from the range.

In some embodiments, features obtained from multiple sets of measurements, each set obtained by a different sensor unit, may be used to determine the presence of a condition in the power distribution network requiring maintenance. As previously mentioned, localized conditions may be determined based on the differences in data collected by sensor units in some locations versus others. Accordingly, in some embodiments, differences in corresponding features, each feature derived from data obtained by a different sensor unit, may be used to determine conditions requiring maintenance. For instance, the difference between the energy of a set of transform coefficient values (e.g., derived from data obtained by sensor unit A) and the energy of a corresponding set of transform coefficient values (e.g., values derived from data obtained by sensor unit B) may fall outside a range, which may indicate the presence of a condition requiring maintenance. This may be the case when an event localized to a power line monitored by sensor unit A (e.g., animal contact with the power line, tree falling on the power line, etc.) is not reflected in any data collected by sensor unit B.

Though, as previously mentioned, some conditions (e.g., snow or ice buildup) may affect many of the power lines in an area. Accordingly, in some embodiments, features derived from data obtained by different sensor units may be used to determine conditions requiring maintenance. For instance, the energy of a set of transform coefficient values and the energy of a corresponding set of transform coefficient values may both fall outside a range, which may indicate the presence of a condition requiring maintenance.

If the presence of a condition in the power distribution network requiring maintenance is determined, process 500 proceeds to act 510, where the type of condition may be identified. On the other hand, if the presence of such a condition is not detected, process 500 proceeds to decision block 512.

The type of the condition or conditions identified in decision block 408 may be determined in any suitable way and, in some embodiments, may be determined by using features derived from data collected by multiple distributed sensor units. As previously mentioned, some of the conditions may affect many power lines in an area whereas other conditions may affect only a single power line. As such, the derived features may be used to identify whether the condition is a local or a non-local condition. For example, differences among corresponding feature values may indicate the presence of a local condition on a power line. Such a local condition may be any of the previously mentioned local conditions including, but not limited to, animal contact with a power line, an object coming into contact with a power line, a lightning strike, equipment failure affecting a power line, and a power fluctuation at a specific location.

As another example, corresponding feature values simultaneously falling within a range may indicate the presence of a non-local condition on a power line. Such a non-local condition may be any of the previously mentioned non-local conditions including, but not limited to, ice forming on multiple power lines, snow weighing down multiple power lines, any other weather condition affecting multiple power lines, and equipment failure affecting multiple power lines.

In some embodiments, features obtained in act 506 may be used to identify the particular type of condition, whether local or non-local. In particular, the features may be used to identify the condition type as being any of the previously listed examples of local and non-local conditions or any other conditions. The classification may be performed in any suitable way using any of numerous pattern recognition, pattern classification, and/or rule-based techniques.

As one example, the energies of transform coefficient values may be used to classify the type of the condition or conditions identified in decision block 408. In particular, the classification may be performed based on one or more rules and/or classifiers applied to the energy values. For example, tree contact with a power line may be differentiated from a lightning strike of the power line based on the energy associated with transform coefficient values associated with the coarsest resolution. Indeed, as illustrated in FIGS. 6B and 6D, the energies associated with the reconstructed signals for resolution $d^1$ (which is indicative of the energy of the transform coefficient values associated with that resolution) are different for the two types of conditions. For the particular illustrated waveforms, the energy for the tree data is 13.64 whereas the energy for the lightning signal is 0.52. Such differences may be used to identify rules and/or train classifiers that may be used to identify the type of condition detected based on the calculated features.

In some embodiments, identifying the condition type may comprise identifying the location of the condition. It should be recognized that even though features derived in act 506, from transform coefficient values calculated in act 404, may be independent of the location of the sensor units that collected the data from which the transform coefficient values were calculated, in some embodiments, the nature of the condition identified may provide information about a location of a fault or other event giving rise to that condition. For example, a condition affecting only certain types of line may be inferred to exist in a location where such lines are present. For example, a condition may relate to only an overhead line or only to a medium voltage line, such that detection of such a condition may provide some information about its location.

Alternatively or additionally, the location of the condition may be identified by using other information with which data received in act 502 may have been tagged. As previously mentioned, this information may include the location of the sensor units that collected the data received in act 502. Such location information may be specified directly or indirectly. For example, each sensor unit may be programmed with location information or may include components, such as a GPS chip set, that determines its location, allowing a sensor unit to directly report its location. Alternatively or additionally, a sensor unit may be programmed with a unique identifier, and a power line management system may be programmed with a map, relating identifiers to locations.

Regardless of how location is indicated, in some embodiments, the location of the sensor units in the power distribution network may be used to identify the location of one or more conditions in the power distribution network. The location, for example, may be specified in any suitable way. It may, for example, be specified in geographic coordinates. As an alternative, location may be specified to be a particular line in a power distribution system at which a sensor unit is attached or at a location between two sensor units. As a specific example, the location of a condition may be identified to be a location between two sensor units, one of which observed data indicative of the presence of the condition and the other one did not. For example, in some embodiments a series of sensor units 704, 706, 708, and 710 may be located along power lines connected to substation 702. Power line segment 712 is located between substation 702 and sensor unit 704, power line segment 714 is located between sensor unit 704 and sensor unit 706, power line segment 716 is located between sensor unit 706 and sensor unit 708, and power line segment 718 is located between sensor unit 708 and sensor unit 710. If one or more features obtained from data collected by sensor unit 706 (and, optionally sensor unit 704) indicate the presence of a condition, but the corresponding features derived from data collected by sensor unit 708 (and, optionally, sensor unit 710) do not indicate the presence of the condition, it may be determined that the condition is located along power line segment 716 between sensor unit 706 and sensor unit 708. This information may be used to dispatch a maintenance crew to power line segment 716 in order to perform maintenance or preventative maintenance as may be appropriate. As such, the location of the condition may be identified based on the location order of the sensor units with respect to the substation. Although in the illustrated embodiment the sensor units are shown to be in a serial geometry with respect to substation 702, it should be appreciated that aspects of the present invention are not limited in this respect and, in other embodiments, the location of a condition may be determined by using any suitable sensor unit geometry with respect to one or more substations.

After the type of the condition or conditions is identified in act 510, process 500 proceeds to act 512, where it is determined whether more data may be received from one or more sensor units. If it is determined that more data may be received, process 500 loops back to act 502, and acts 502, 504, 506, and 510 and decision block 508 are repeated. On the other hand, if it is determined that no more data may be received, process 400 completes.

It should be recognized that process 500 is illustrative and that many variations of process 500 are possible. For example, in the illustrated embodiment, a computing device or devices performing process 500 (e.g., controller 150) receive data from multiple sensor units in act 502 and, subsequently, apply a shift-invariant transformation to the received data. However, in other embodiments, process 400 may be adapted such that the computing device(s) performing the process are configured to receive transform coefficient values obtained by applying a shift-invariant transformation to sensor data. In these embodiments, the transform coefficient values may be computed by one or more other computing devices and, for example, may be computed using the sensor units that collected the data as discussed in more detail below with reference to FIGS. 8A and 8B.

Figures 8A, 8B:
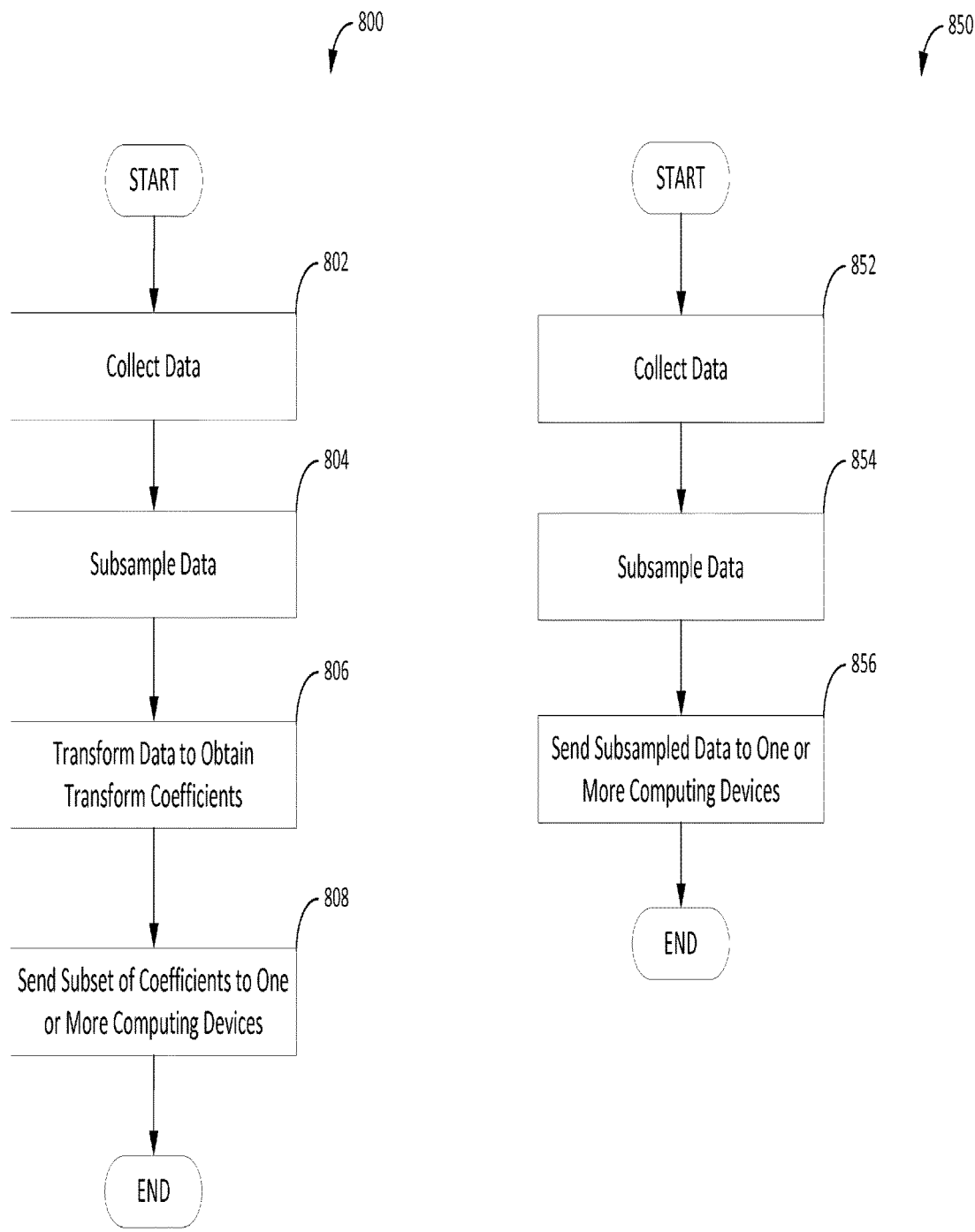
FIGS. 8A and 8B are flowcharts of illustrative processes for processing data collected by at least one sensor unit, in accordance with some embodiments of the present invention.

FIGS. 8A and 8B show flowcharts of illustrative processes 800 and 850, respectively, for processing data collected by at least one sensor unit. Processes 800 and 850 may be executed by any sensor unit and, for example, may be performed by sensor unit 110 described with reference to FIG. 2. In particular, in some embodiments, acts of processes 800 and 850 may be performed by control circuitry 230 described with reference to FIG. 2.

Processes 800 and 850 begin in acts 802 and 852, respectively, where a sensor unit executing either of these processes may collect data. In each case, the sensor unit may be configured to collect any suitable type of data and may collect the data using any of the previously mentioned sensors that may be included in the sensor unit. For example, the sensor unit may collect data using an inclinometer, an accelerometer, a thermocouple, a power-line interface coupled with electrical property extraction circuitry, and/or any other suitable sensor or circuitry.

Next, processes 800 and 850 proceed to acts 804 and 854, respectively, where the collected data may be subsampled. The data may be subsampled in any suitable way using techniques known in the art to obtain data at a desired data rate. The desired data rate may be specified in any suitable way. For example, the desired data rate may be lower than the rate at which measurements are obtained by the sensor unit. This may result in lower bandwidth requirements for transmitting information to one or more computing devices (e.g., controller 150) from the sensor unit. As another example, the desired data rate may be equal to the rate at which measurements are obtained by the sensor unit. This may result in a higher bandwidth requirement, but no measured data is discarded prior to transmission.

The desired data rate may be set in any suitable way and may be set before processes 800 and 850 begin executing or may be dynamically set while the processes are executing. In the latter case, the desired data rates may be set to be higher data rates when a sensor unit is likely to collect data indicative of the presence of one or more conditions in the power distribution network. This may be done in any suitable way and, for example, a sensor unit may receive a command from another computing device (e.g., controller 150) to increase the desired data rate. Such a command may be issued in response to an event such as another sensor unit reporting a condition, a predicted weather event, or any other suitable event.

Regardless of how the desired data rate is set in act 854, process 850 proceeds to act 856, where subsampled data is sent to one or more computing devices. The data may be sent to the computing device(s) in any suitable way including, but not limited to, any of the previously described ways such as wirelessly or using the power line to which the sensor unit is attached. The data may be sent to any suitable computing device or devices including any computing device(s) configured to process the received data to determine the presence of one or more conditions in the power distribution network requiring maintenance. For instance, the data may be sent to controller 150 described with reference to FIG. 1.

In contrast, after act 804, process 800 proceeds to act 806, where the subsampled data may be transformed by using a shift-invariant transformation. Any suitable shift-invariant transformation may be applied including any of the previously described shift-invariant transformations including, but not limited to, the stationary wavelet transformation, the continuous wavelet transformation, or any variant thereof. As previously described, applying the shift-invariant transformation to the data may produce one or more transform coefficient values.

Next, process 800 proceeds to act 808, where one or more of the transform coefficient values may be sent to one or more computing devices. The transformed coefficient values may be sent to the computing device(s) in any suitable way including, but not limited to, any of the previously described ways for transmitting data from a sensor unit. The data may be sent to any suitable computing device or devices including any computing device(s) configured to process the received transform coefficient values to determine the presence of one or more conditions in the power distribution network requiring maintenance. For instance, the data may be sent to controller 150 described with reference to FIG. 1.

It should be appreciated that processes 800 and 850 are based on alternative architectures for how and where to process data collected by multiple distributed sensor units deployed in a power distribution network. In the case of process 800, a shift-invariant transformation may be applied to the data at the sensor unit, whereas in the case of process 850 such a transformation may be applied to the data by a device (e.g., controller 150) other than the sensor unit that collected the data. It should be recognized that many other alternative architectures are possible. For instance, a sensor unit may perform other data processing steps such as obtaining one or more features from transform coefficient values and transmitting the obtained features to one or more other computing devices.

The inventors have recognized and appreciated that conditions in the power distribution network may be identified by using one or more user-defined templates, which may provide users with flexibility to specify how data collected by one or more sensor units may be interpreted. Determining the presence of one or more conditions that require maintenance by relying on user-defined templates may be realized, in some instances, with fewer computational resources such as processing power and memory. In particular, determining the presence of one or more conditions by using user-defined templates may be performed without applying shift-invariant transformations to the data collected by the sensor units and may avoid the computational expense of performing such transformations. In addition, the resultant rules may be more readily interpreted by other humans involved in monitoring or maintaining a power distribution network or performing any other related function.

A user may define a template comprising one or more rules determining the presence of a condition from the data collected by one or more sensor units deployed in the power distribution network. Each rule may be parameterized by one or more parameters. The template may further comprise one or more parameter value ranges specified by the user for one or more of these parameters. A value for each of the parameters in the rule(s) in the user-defined template may be obtained, and a rules engine (e.g., rules engine 330) may be configured to execute the rule(s) in the user-defined template by determining whether the obtained parameter values fall outside the parameter value ranges specified by the user, which may be indicative of the presence of a condition requiring maintenance.

Any of numerous types of rules may be employed. For example, executing a rule for determining a condition associated with lightning may comprise determining whether at least one sensor unit measured a level of current exceeding 5000 Amperes and whether multiple sensor units detected trips. As another example, executing a rule for detecting a condition associated with a tree coming into contact with a power line may comprise determining whether at least one sensor unit measured a level of current anywhere from 2500 to 5000 Amperes for at least 3 to 5 cycles. As yet another example, executing the rule for detecting a condition associated with an animal coming into contact with a power line may comprise determining whether only one sensor unit measured a level of current between 4000 and 6000 Amperes. Though, it should be recognized that these are merely illustrative of rules and that a user-defined template may comprise any other suitable rules.

Figure 9:
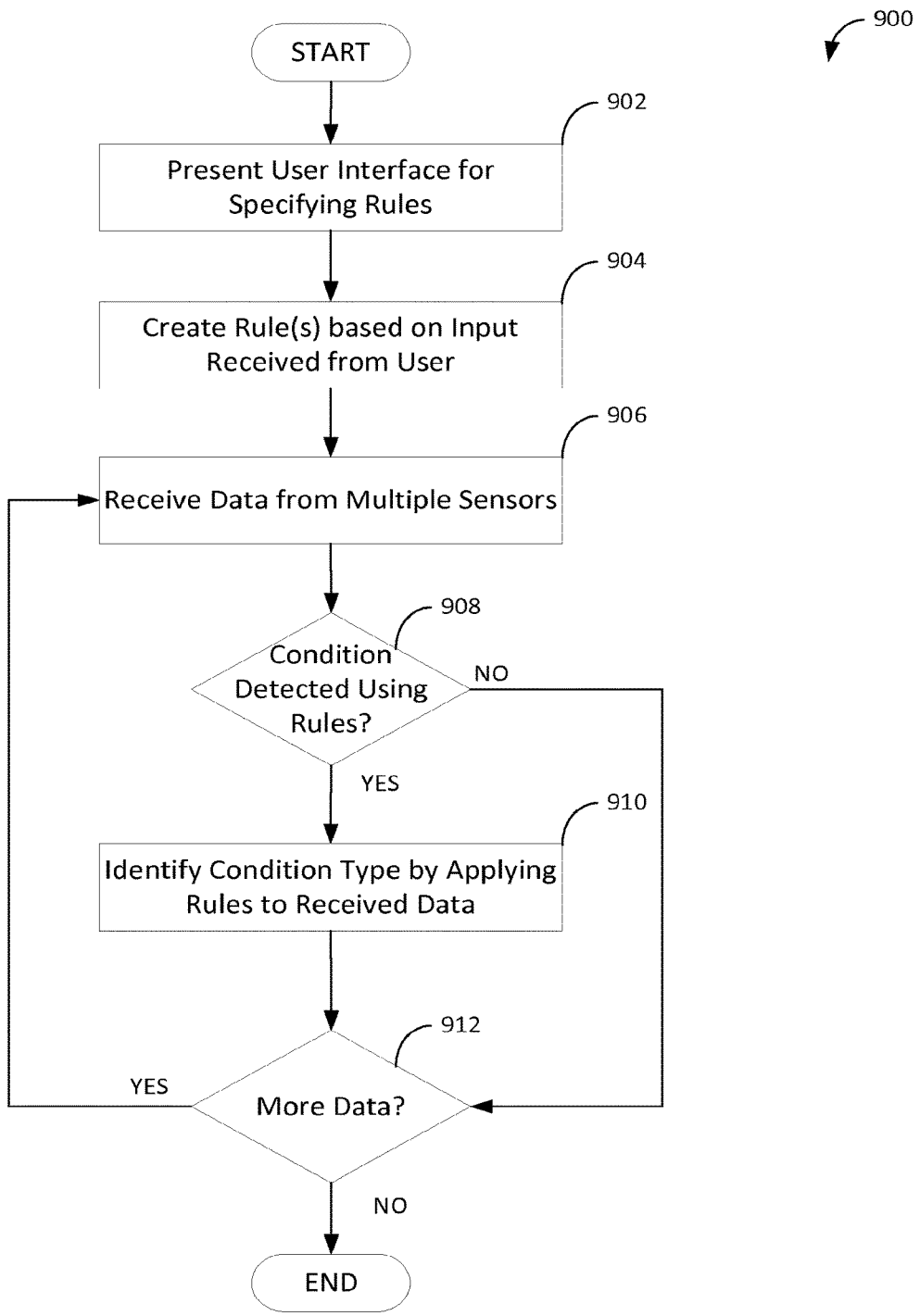
FIG. 9 is a flowchart of another illustrative process for determining at least one condition of one or more power lines needing maintenance, in accordance with some embodiments of the present invention.

Numerous techniques may be used to determine conditions requiring maintenance by employing user-defined templates. One such technique is illustrated in FIG. 9, which is a flowchart of an illustrative process 900 for determining conditions requiring maintenance in a power distribution network.

Process 900 begins in act 902, where a user may be presented with a user interface to specify one or more rules as part of a user-defined template. The user may be presented with any suitable type of interface and, for example, may be presented with a graphical user interface. The user interface may allow the user to specify one or more rules for determining the presence of conditions and to provide any information needed for the execution of such rules (e.g., parameter ranges associated with the rules, configuring settings, etc.). For example, the user may specify a rule as a function of property values measured directly or indirectly by one or more sensor units. The rule may be specified as a function of a single property value and/or patterns of property values. Any suitable patterns may be used including temporal patterns, frequency patterns, etc. The measured properties may be any of numerous types of properties including, but not limited to, electrical properties such as current and voltage, thermal properties such as temperature, inertial properties such as acceleration, velocity, and inclination, and any other properties. The user may further specify ranges of values for measured property values (or patterns of property values) such that when any of the measured property values fall outside these ranges, this may be indicative of a condition in the power distribution network.

A user may be presented with a rule for which the user may be prompted to specify one or more parameters. As a non-limiting example, a user may be presented with a rule in a template such as: "if _____ sensor unit measures _____ of the normal value for at least _____ cycles, then raise an alarm indicating _____," and be prompted to provide parameters associated with the missing data. In response to the prompting, the user may provide parameters including "any," "current," ">", "40%," "10," and "over current" as input to produce the rule: "If any sensor unit measures current>40% of the normal value for at least ten cycles, then raise an alarm indicating overcurrent." Many other similar examples will be apparent to those skilled in the art.

Next, process 900 proceeds to act 904, where one or more rules may be created based on input received from the user via the user interface presented to the user in act in 902. The rules may be created in any suitable way and may be stored in any suitable format as the way in which the rules are created and/or stored is not limitation of aspects of the present invention.

Next process 900 proceeds to act 906, where data may be received from one or more sensor units deployed in the power distribution network. Act 906 may be performed in any suitable way and, for example, may be performed in the same way as act 502 of process 500. As such, any of numerous types of data may be received in act 906, including data collected by any suitable type of sensors and any information with which such data may be tagged, for example, information including the location of the sensor units used to collect the received data.

Next, process 900 proceeds to decision block 908, where one or more rules specified in the user-defined template may be used to determine the presence of a condition in the power distribution network. This may be done in any suitable way. For example, a value for each of the parameters in the rule(s) may be obtained from data received in act 906 and a rules engine (e.g., rules engine 330) may be configured to execute the rules) by determining whether the parameter values fall into the parameter value ranges specified by the user.

It should be appreciated that executing a rule may comprise obtaining values measured by multiple sensors. Accordingly, rule-based detection of conditions in a power distribution network may take advantage of the deployment of multiple distributed sensors in the network.

If the presence of a condition in the power distribution network requiring maintenance is determined in act 908, process 900 proceeds to act 910 where the type of condition may be identified. On the other hand, if the presence of such a condition is not detected, process 900 proceeds to decision block 912.

The type of the condition or conditions identified in decision block 808 may be determined in any suitable way and, in some embodiments, may be determined by using one or more rules specified in the user-defined template. For example, the user-defined template may include one or more rules for identifying whether the detected condition is a local condition or a non-local condition. The user-defined template may further comprise one or more rules for determining the type of the condition as one of any of the previously described conditions both local and non-local.

Additionally, one or more rules may be used to identify the location of the detected condition. For example, executing a rule for identifying the location of the detected condition may comprise determining which sensor unit or units detected the condition and which sensor units did not detect the condition. Indeed, rules may be used to embody any of the previously described techniques for identifying the location of a condition based on where sensor units are deployed relative to one or more substations.

After the type of the condition or conditions is identified in act 910, process 900 proceeds to act 912, where it is determined whether more data may be received from one or more sensor units. If it is determined that more data may be received, process 900 loops back to act 902, and acts 902, 904, 906, and 910 and decision block 908 are repeated. On the other hand, if it is determined that no more data may be received, process 900 completes.

One of skill in the art may recognize, that the above described capabilities to collect, correlate, and analyze outputs of multiple types of sensors at multiple locations may be employed to determine other important conditions. Accordingly, the invention should not be limited to the specific conditions described as examples herein.

Figure 10:
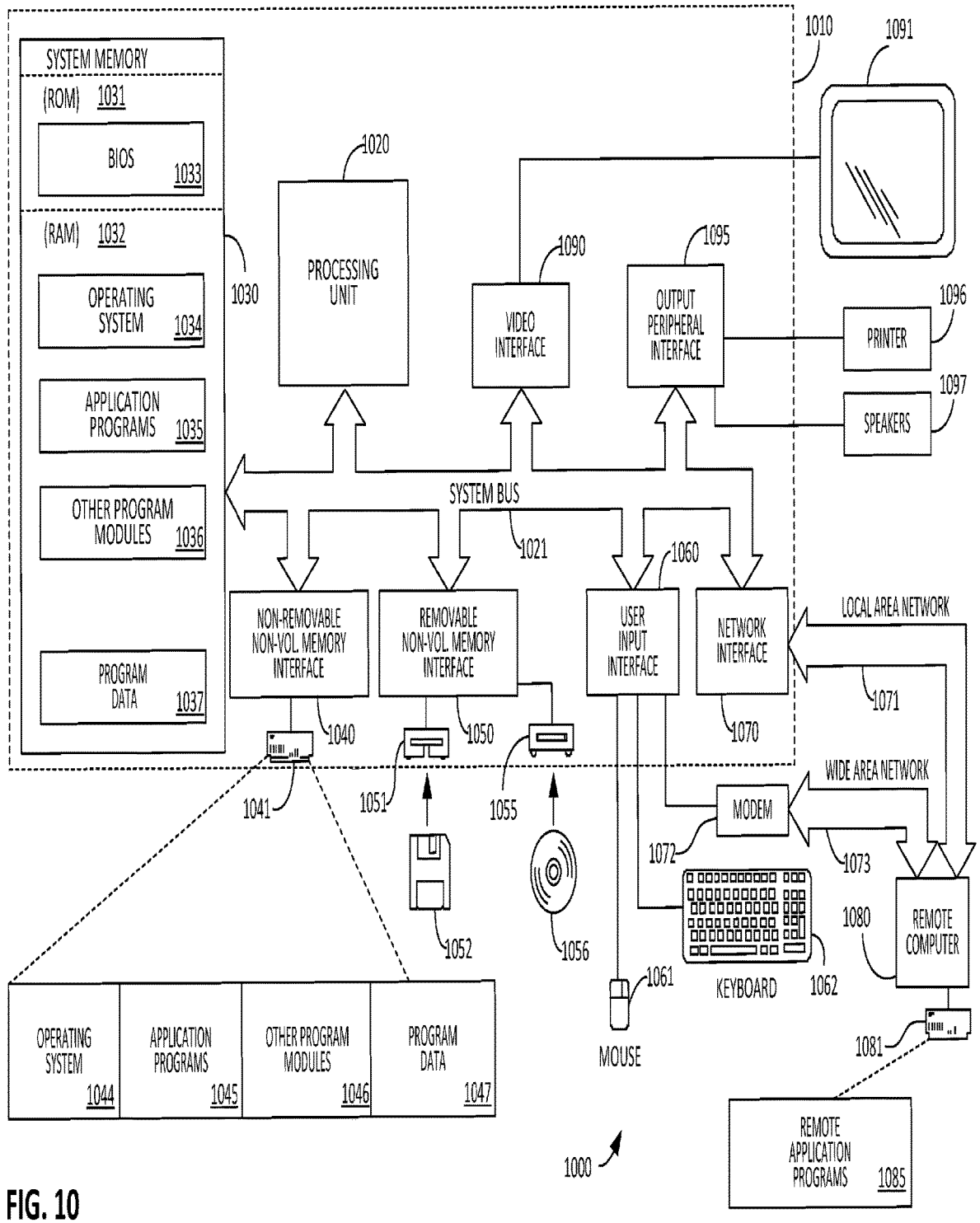
FIG. 10 is a block diagram of a computing device that may be configured to produce output based on a determined condition of one or more power lines needing maintenance, in accordance with some embodiments of the present invention.

Moreover, it should be appreciated that processing as described herein is not limited to use of the specific components described herein. Nonetheless, FIG. 10 provides an example of a processing environment, such as may exist within controller 150. FIG. 10 illustrates an example of a suitable computing system environment 1000 on which the invention may be implemented. The computing system environment 1000 is only one example of a suitable computing environment and is not intended to suggest any limitation as to the scope of use or functionality of the invention. For example, in some embodiments, sensor units (e.g., sensor units 116A and 116B) may be implemented using a special purpose computing environment. Neither should the computing environment 1000 be interpreted as having any dependency or requirement relating to any one or combination of components illustrated in the exemplary operating environment 1000.

The invention is operational with numerous other general purpose or special purpose computing system environments or configurations. Examples of well-known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The computing environment may execute computer-executable instructions, such as program modules. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

With reference to FIG. 10, an exemplary system for implementing the invention includes a general purpose computing device in the form of a computer 1010. Components of computer 1010 may include, but are not limited to, a processing unit 1020, a system memory 1030, and a system bus 1021 that couples various system components including the system memory to the processing unit 1020. The system bus 1021 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 1010 typically includes a variety of computer readable media. Computer readable media can be any available media that can be accessed by computer 1010 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 1010. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 1030 includes computer storage media in the form of volatile and/or nonvolatile memory such as read only memory (ROM) 1031 and random access memory (RAM) 1032. A basic input/output system 1033 (BIOS), containing the basic routines that help to transfer information between elements within computer 1010, such as during start-up, is typically stored in ROM 1031. RAM 1032 typically contains data and/or program modules that are immediately accessible to and/or presently being operated on by processing unit 1020. By way of example, and not limitation, FIG. 10 illustrates operating system 1034, application programs 1035, other program modules 1036, and program data 1037.

The computer 1010 may also include other removable/non-removable, volatile/nonvolatile computer storage media. By way of example only, FIG. 10 illustrates a hard disk drive 1041 that reads from or writes to non-removable, nonvolatile magnetic media, a magnetic disk drive 1051 that reads from or writes to a removable, nonvolatile magnetic disk 1052, and an optical disk drive 1055 that reads from or writes to a removable, nonvolatile optical disk 1056 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 1041 is typically connected to the system bus 1021 through an non-removable memory interface such as interface 1040, and magnetic disk drive 1051 and optical disk drive 1055 are typically connected to the system bus 1021 by a removable memory interface, such as interface 1050.

The drives and their associated computer storage media discussed above and illustrated in FIG. 10, provide storage of computer readable instructions, data structures, program modules and other data for the computer 1010. In FIG. 10, for example, hard disk drive 1041 is illustrated as storing operating system 1044, application programs 1045, other program modules 1046, and program data 1047. Note that these components can either be the same as or different from operating system 1034, application programs 1035, other program modules 1036, and program data 1037. Operating system 1044, application programs 1045, other program modules 1046, and program data 1047 are given different numbers here to illustrate that, at a minimum, they are different copies. A user may enter commands and information into the computer 1010 through input devices such as a keyboard 1062 and pointing device 1061, commonly referred to as a mouse, trackball or touch pad. Other input devices (not shown) may include a microphone, joystick, game pad, satellite dish, scanner, or the like. These and other input devices are often connected to the processing unit 1020 through a user input interface 1060 that is coupled to the system bus, but may be connected by other interface and bus structures, such as a parallel port, game port or a universal serial bus (USB). A monitor 1091 or other type of display device is also connected to the system bus 1021 via an interface, such as a video interface 1090. In addition to the monitor, computers may also include other peripheral output devices such as speakers 1097 and printer 1096, which may be connected through a output peripheral interface 1095.

The computer 1010 may operate in a networked environment using logical connections to one or more remote computers, such as a remote computer 1080. The remote computer 1080 may be a personal computer, a server, a router, a network PC, a peer device or other common network node, and typically includes many or all of the elements described above relative to the computer 1010, although only a memory storage device 1081 has been illustrated in FIG. 10. The logical connections depicted in FIG. 10 include a local area network (LAN) 1071 and a wide area network (WAN) 1073, but may also include other networks. Such networking environments are commonplace in offices, enterprise-wide computer networks, intranets and the Internet.

When used in a LAN networking environment, the computer 1010 is connected to the LAN 1071 through a network interface or adapter 1070. When used in a WAN networking environment, the computer 1010 typically includes a modem 1072 or other means for establishing communications over the WAN 1073, such as the Internet. The modem 1072, which may be internal or external, may be connected to the system bus 1021 via the user input interface 1060, or other appropriate mechanism. In a networked environment, program modules depicted relative to the computer 1010, or portions thereof, may be stored in the remote memory storage device. By way of example, and not limitation, FIG. 10 illustrates remote application programs 1085 as residing on memory device 1081. It will be appreciated that the network connections shown are exemplary and other means of establishing a communications link between the computers may be used.

It should be recognized that a rules engine is but one example of a technique for drawing conclusions based on measured data. As such, other techniques for drawing conclusions from data may be used in any of the above described embodiments of the present invention. For example, conclusions may be drawn heuristically, using machine learning techniques, and the like.

Having thus described several aspects of at least one embodiment of this invention, it is to be appreciated that various alterations, modifications, and improvements will readily occur to those skilled in the art.

For example, embodiments are described in connection with a power distribution system used to deliver power from generation facilities to consumers of that power. The techniques described herein may be applied to Transmission and Distribution conductors in any setting. For example, power lines are used by the railway and streetcar industries, which may also have overhead conductors.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a computer-readable medium that can be considered to be a manufacture (i.e., article of manufacture) or a machine. Alternatively or additionally, the invention may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The invention claimed is:

1. A method for determining conditions of power lines in a power distribution system based on measurements collected by a plurality of sensor units deployed in the power distribution system, the method comprising:

obtaining first transformed data associated with a first set of measurements collected by a first sensor unit associated with a first power line in the plurality of sensor units and second transformed data associated with a second set of one or more measurements collected by a second sensor unit associated with a second power line in the plurality of sensor units, the first transformed data comprising a first plurality of transform coefficient values calculated by applying a shift-invariant transformation to the first set of measurements, the second transformed data comprising a second plurality of transform coefficient values calculated by applying the shift-invariant transformation to the second set of measurements;

determining, by using at least one processor and based at least in part on one or more features calculated from the first transformed data and the second transformed data, at least one condition of at least one power line in the power distribution system requiring maintenance, wherein the first sensor unit and the second sensor unit are coupled to different power line segments; and classifying the at least one condition as one of a local condition and a non-local condition based on the one or more features calculated from the first transformed data and the second transformed data, wherein local conditions are associated with a specific location and non-local conditions are associated with multiple power lines;

wherein the one or more features are patterns associated with a subset of the first plurality of transform coefficient values and the second plurality of transform coefficient values, and wherein the patterns are defined in terms of one of an amount of energy or an absence of energy of each of the subset of one or more of the first plurality of transform coefficient values and the second plurality of transform coefficient values.

2. The method of claim 1, wherein:

obtaining the first transformed data comprises applying the shift-invariant transformation to the first set of measurements to produce the first plurality of transform coefficient values; and obtaining the second transformed data comprises applying the shift-invariant transformation to the second set of measurements to produce the second plurality of transform coefficient values.

3. The method of claim 1, wherein:

obtaining the first transformed data comprises receiving the first plurality of transform coefficient values; and obtaining the second transformed data comprises receiving the second plurality of transform coefficient values.

4. The method of claim 1, wherein determining the at least one condition comprises:
calculating a first feature from a first subset of transform coefficient values in the first plurality of transform coefficient values and a second feature from a corresponding subset of transform coefficient values in the second plurality of transform coefficient values; and
determining the at least one condition based on the first and second features.

5. The method of claim 2, wherein the shift-invariant transformation is a shift-invariant multi-resolution transformation such that the first plurality of transform coefficients values comprises at least a first set of transform coefficient values associated with a first resolution and a second set of transform coefficient values associated with a second resolution, wherein the first resolution is different from the second resolution, and wherein determining the at least one condition comprises:
determining a first condition based on one or more features obtained using only coefficient values in the first set of transform coefficient values and corresponding transform coefficient values in the second plurality of transform coefficient values.

6. The method of claim 2, wherein applying the shift-invariant transformation to the first set of measurements comprises applying a shift-invariant wavelet transformation to the first set of measurements.

7. The method of claim 1, wherein the shift-invariant transformation is a multi-resolution shift-invariant transformation.

8. A system for monitoring a power distribution system based on data collected using a plurality of sensor units configured to be coupled to different power lines of a plurality of power lines in a power distribution system wherein the plurality of sensor units includes a first sensor unit coupled to a first power line of the plurality of power lines and a second sensor unit adapted to be coupled to a second power line of the plurality of power lines, both the first and second sensor units configured to:
collect a respective set of one or more measurements from a power line;
apply a shift-invariant transformation to the respective set of one or more measurements to produce a first plurality of transform coefficient values, and,
transmit transform coefficient values in the first plurality of transformed coefficient values to a computing device, wherein the computing device comprises:
at least one controller configured to:
obtain first transformed data associated with a first set of measurements collected by the first sensor unit and second transformed data associated with a second set of one or more measurements collected by the second sensor unit, the first transformed data comprising a first plurality of transform coefficient values calculated by applying a shift-invariant transformation to the first set of measurements, the second transformed data comprising a second plurality of transform coefficient values calculated by applying the shift-invariant transformation to the second set of measurements;
determine, based at least in part on one or more features calculated form the first transformed data and the second transformed data, at least one condition of at least one power line in the power distribution system requiring maintenance, wherein the one or more features are patterns associated with a subset of the first plurality of transform coefficient values and the second plurality of transform coefficient values; and
classify the at least one condition as one of a local condition and a non-local condition based on the one or more features calculated from the first transformed data and the second transformed data, wherein local conditions are associated with a specific location within the power distribution system and non-local conditions are associated with multiple power lines;
wherein the at least one condition is determined in response to an energy of a subset of one or more of the first plurality of transform coefficient values and the second plurality of transform coefficient values exceeding a threshold; and
wherein the at least one condition is classified as the non-local condition in response to the energy of the subset of both of the one or more of the first plurality of transform coefficient values and the second plurality of transform coefficient values exceeding the threshold.

9. The system of claim 8, wherein each sensor unit in the plurality of sensor units is configured to apply the shift-invariant transformation to the respective set of one or more measurements by applying a stationary wavelet transform or a continuous wavelet transform to the respective set of one or more measurements.

10. The system of claim 8, wherein each sensor unit in the plurality of sensor units is configured to collect the respective set of one or more measurements by using an inclinometer and/or accelerometer.

11. The system of claim 8, wherein the at least one controller is configured to:
obtain the first transformed data by applying the shift-invariant transformation to the first set of measurements to produce the first plurality of transform coefficient values; and
obtain the second transformed data by applying the shift-invariant transformation to the second set of measurements to produce the second plurality of transform coefficient values.

12. The system of claim 11, wherein the first plurality of transform coefficient values comprises at least a first set of transform coefficient values associated with a first resolution and a second set of transform coefficient values associated with a second resolution, wherein the first resolution is different from the second resolution; and, wherein the at least one controller is configured to determine the presence of the at least one condition by:
determining a first condition based on one or more features obtained using only coefficient values in the first set of transform coefficient values and corresponding transform coefficient values in the second plurality of transform coefficient values.

13. The system of claim 11, wherein the at least one controller is configured to apply a multi-resolution shift-invariant transformation to the first set of measurements by applying a stationary wavelet transform or a continuous wavelet transform to the first set of measurements.

14. The system of claim 8, wherein the at least one controller is configured to:
obtain the first transformed data by receiving the first plurality of transform coefficient values; and
obtain the second transformed data by receiving the second plurality of transform coefficient values.

15. At least one non-transitory tangible computer readable storage medium storing processor-executable instructions that, when executed by at least one processor, cause the at least one processor to perform a method for determining conditions of power lines in a power distribution system based on data collected by a plurality of sensor units deployed at multiple locations in the power distribution system, the method comprising:

obtaining first transformed data associated with a first set of one or more measurements collected by a first sensor unit in the plurality of sensor units associated with a first power line and second transformed data associated with a second set of one or more measurements collected by a second sensor unit in the plurality of sensor units associated with a second power line, the first transformed data comprising a first plurality of transform coefficient values calculated by applying a shift-invariant transformation to the first set of measurements, the second transformed data comprising a second plurality of transform coefficient values calculated by applying the shift-invariant transformation to the second set of measurements;

determining, by using at least one processor and based at least in part on one or more features calculated from the first transformed data and the second transformed data, at least one condition of at least one power line in the power distribution system requiring maintenance, wherein the first sensor unit and the second sensor unit are coupled to different power line segments; and classifying the at least one condition as one of a local condition and a non-local condition based on the one or more features calculated from the first transformed data and the second transformed data;

wherein the one or more features are patterns associated with a subset of one or more of the first plurality of transform coefficient values and the second plurality of transform coefficient values, and wherein the patterns are defined in terms of one of an amount of energy or an absence of energy of each of the subset of one or more of the first plurality of transform coefficient values and the second plurality of transform coefficient values.

16. The at least one non-transitory tangible computer readable storage medium of claim 15, wherein obtaining the first transformed data comprises applying the shift-invariant transformation to the first set of measurements to produce the first plurality of transform coefficient values and obtaining the second transformed data comprises applying the shift-invariant transformation to the second set of measurements to produce the second plurality of transform coefficient values.

17. The at least one non-transitory tangible computer readable storage medium of claim 15, wherein obtaining the first transformed data comprises receiving the first plurality of transform coefficient values and obtaining the second transformed data comprises receiving the second plurality of transform coefficient values.

18. The at least one non-transitory tangible computer readable storage medium of claim 15, wherein determining the at least one condition comprises:

calculating a first feature from a first subset of transform coefficient values in the first plurality of transform coefficient values and a second feature from a corresponding subset of transform coefficient values in the second plurality of transform coefficient values; and determining the at least one condition based on the first and second features.

19. The at least one non-transitory tangible computer readable storage medium of claim 15, wherein the shift-invariant transformation is a shift-invariant multi-resolution transformation such that the first plurality of transform coefficient values comprises at least a first set of transform coefficient values associated with a first resolution and a second set of transform coefficient values associated with a second resolution, wherein the first resolution is different from the second resolution, and wherein determining the at least one condition comprises:

determining a first condition based on one or more features obtained using only coefficient values in the first set of transform coefficient values and corresponding transform coefficient values in the second plurality of transform coefficient values in the second plurality of transform coefficient values.

20. The at least one non-transitory tangible computer readable storage medium of claim 15, wherein applying the shift-invariant transformation to the first set of measurements comprises applying a shift-invariant wavelet transformation to the first set of measurements.

* * * * *